(12) United States Patent
Ghannouchi et al.

(10) Patent No.: US 12,341,544 B2
(45) Date of Patent: Jun. 24, 2025

(54) APPARATUS AND METHOD FOR ARTIFICIAL INTELLIGENCE DRIVEN DIGITAL PREDISTORTION IN TRANSMISSION SYSTEMS HAVING MULTIPLE IMPAIRMENTS

(71) Applicants: Fadhel Ghannouchi, Calgary (CA); Ahmadreza Motaqi, Calgary (CA); Mohamed Helaoui, Calgary (CA)

(72) Inventors: Fadhel Ghannouchi, Calgary (CA); Ahmadreza Motaqi, Calgary (CA); Mohamed Helaoui, Calgary (CA)

( * ) Notice: Subject to any disclaimer, the term of this patent is extended or adjusted under 35 U.S.C. 154(b) by 0 days.

(21) Appl. No.: 18/125,642

(22) Filed: Mar. 23, 2023

(65) Prior Publication Data

US 2023/0268942 A1    Aug. 24, 2023

Related U.S. Application Data

(63) Continuation of application No. PCT/CA2022/050185, filed on Feb. 9, 2022.

(60) Provisional application No. 63/161,912, filed on Mar. 16, 2021.

(51) Int. Cl.
*H04B 1/04* (2006.01)

(52) U.S. Cl.
CPC ... *H04B 1/0475* (2013.01); *H04B 2001/0425* (2013.01)

(58) Field of Classification Search
CPC .............. H04B 1/0475; H04B 2001/0425
USPC .......................................................... 375/297
See application file for complete search history.

(56) References Cited

U.S. PATENT DOCUMENTS

| | | | | |
|---|---|---|---|---|
| 7,279,972 | B2* | 10/2007 | Smithson | H03F 1/3247 |
| | | | | 330/149 |
| 8,340,602 | B1* | 12/2012 | Peiris | H03F 1/3241 |
| | | | | 455/114.3 |
| 9,276,602 | B1* | 3/2016 | Pagnanelli | H03M 1/1038 |
| 2011/0025414 | A1* | 2/2011 | Wolf | H04B 1/0475 |
| | | | | 330/149 |
| 2015/0061774 | A1* | 3/2015 | Hammi | H03F 1/0288 |
| | | | | 330/291 |
| 2017/0353163 | A1* | 12/2017 | Gazneli | H03F 3/195 |
| 2018/0159483 | A1* | 6/2018 | Masood | H03F 3/217 |
| 2020/0021253 | A1* | 1/2020 | Ghannouchi | H03C 1/06 |
| 2022/0385317 | A1* | 12/2022 | Jung | H03F 1/30 |
| 2023/0006741 | A1* | 1/2023 | Lv | H04B 10/25752 |

* cited by examiner

*Primary Examiner* — Kevin M Burd

(57) ABSTRACT

An artificial intelligence (AI) driven linearizer for a transmitter, comprising an input interface for inputting linearizer signals comprising information carrying signals, and operating conditions parameter signals, other than the information carrying signal, wherein the operating conditions parameter signals represent metrics affecting transfer characteristics of the transmitter, over a selected operating range of the transmitter, and a predistortion actuator circuit configured with an AI predistortion model for predistorting at least part of the information carrying signal to produce predistorted signals, the predistortion model being configured to be operable for adaptation to said characteristics of the transmitter using a single set of model coefficients that are unchanged over said entirety of said selected operating range.

20 Claims, 10 Drawing Sheets

Fig. 1b: Prior Art

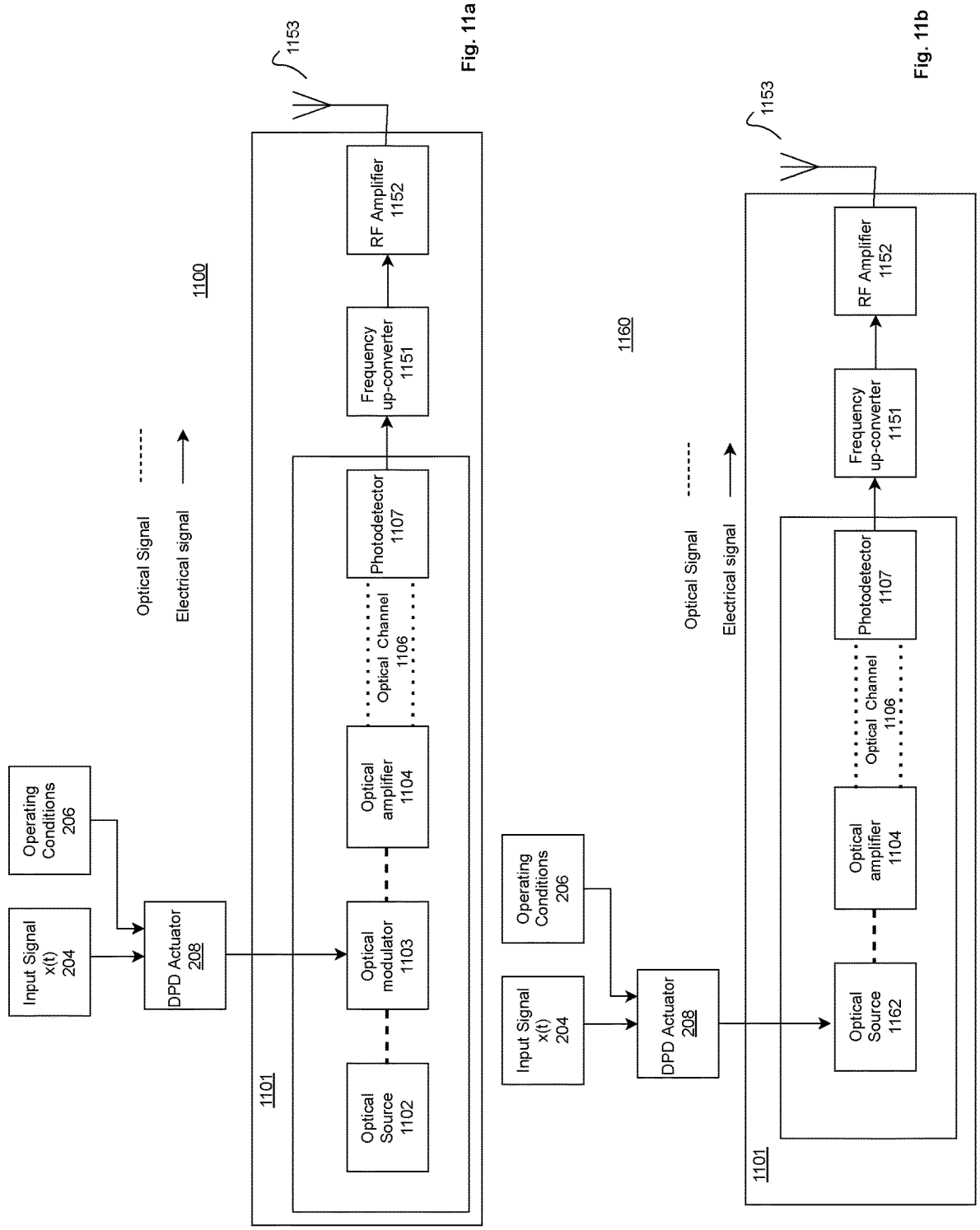

APPARATUS AND METHOD FOR ARTIFICIAL INTELLIGENCE DRIVEN DIGITAL PREDISTORTION IN TRANSMISSION SYSTEMS HAVING MULTIPLE IMPAIRMENTS

TECHNICAL FIELD

This matter relates to systems, apparatus and methods in the field of impairment compensation and linearization of signal transceivers using digital predistortion (DPD) techniques, and application of these techniques to linearization in systems subject to multiple different impairments, such as multi-antenna systems, multi-input multi-output (MIMO) systems, single-input single-output (SISO) systems, where the system may be one or more of wireless, wired, optical and optoelectronic systems, or combinations thereof.

BACKGROUND

A radio frequency (RF) transceiver system in its simplest architecture forms a transmission signal by inputting a baseband signal encoding information to be transmitted, up converting the input information encoded signal to an RF signal and transmitting the signal via a power amplifier (PA) to an antenna for over the air (OTA) data transmission. Of necessity PA's must be operated at high efficiency. Nonlinearities of the PA introduce significant distortion when operated at high efficiency, which in turn introduces nonlinearities and distortion in the transmitted signal that degrade signal quality and limiting the system capacity and its energy efficiency. This poses both an operational and design challenge to performance requirements specified by a particular technology standard within which the transceiver system is to operate. For example, telecommunication technology standards are set by 3rd Generation Partnership Project (3GPP) for long term evolution (LTE), fifth generation (5G), 6G and beyond, which specify these performance requirements.

Demand for increased data capacity due to increasing numbers of wireless users, and increased data speed requirements has shifted attention from less complex SISO systems to more complex MIMO systems, wherein the latter uses spatial multiplexing coding to split the data stream into multiple channels to increase data speed and network capacity. Furthermore, with requirements of increased communication quality of 5G, 6G and beyond, focus has further shifted to massive MIMO (mMIMO) systems which provide directional radio transmission with a highly focused beam pointing to a specific direction. In mMIMO systems this beamforming and steering, is derived from antenna arrays with a larger number (e.g., hundreds or thousands) of elements within a small area to achieve higher antenna gain and directivity, and subsequently, higher data rates.

DPD is widely used in radio transceivers to enhance the signal quality and compensate for the transmitter impairments and is one of the most common techniques to linearize PAs, where the PAs operate near their nonlinear region, to achieve the best energy efficiency. By applying the DPD techniques in radio systems, the PA efficiency increases while maintaining its transmission spectral mask. DPD digitally predistorts an originating signal applied to a transmission chain, such that, when the transmission chain distorts the applied signal; the overall received signal output from the transmission chain has a linear relation with the originating signal. This is equivalent to cascading a so-called the inverse model in the transmission chain.

As will be appreciated, while the PA impairments in the RF chain plays significant contributory role in the overall efficiency of the transmitter. Additional contributory impairments to performance arise with the use of multiple antennas and active beamforming arrays. These may include antenna crosstalk; mutual coupling between antenna's elements; multi-channel time delay (caused by phase error of RF phase shifters and path discrepancy); and power level variations in RF chains, attributed to side-lobe control requirements. There are various types of beamforming techniques, from lens-based, digital, analog, and analog-digital hybrid techniques. The most common ones are the fully digital and hybrid beamforming techniques. These techniques use phased array antennas (PAA) to steer the beam in different directions. Depending on the operating frequency, the distancing between PAA elements varies; higher operating frequencies entail closer PAA element spacing. Reducing distance between the PAA elements increases coupling effects between the antenna elements, contributing to signal quality degradation. With MIMO and mMIMO which comprise several RF paths combined with beamforming; a bigger challenge arises in terms of DPD application.

DPD is based on deriving a behavioral model of the PA which may be classified as memoryless models or memory models (which includes linear memory and nonlinear memory). Model parameter estimation techniques used depend on the structure of the model. The DPD model is configured in a DPD actuator. Distortion compensation is performed on the input information carrying signals applied directly to the DPD actuator prior to transmission. PA characteristics vary over time and operating conditions. Thus, a feedback loop is typically used for adaption to transform a static DPD design into an adaptive one. Error calculation in the feedback loop may for example be based on a least mean square (LMS) algorithm or on a recursive predictor error method (RPEM) algorithm. In practice multiple sets of DPD model coefficients are created during training, feedback signals from the output of the PA are applied directly to adaption circuitry during operation, which selects an appropriate set of DPD coefficients for the DPD actuator based on the feedback.

SUMMARY

In accordance with embodiments of the present matter there is provided an artificial intelligence (AI) driven linearization method, system, and apparatus for a signal communication system.

In an aspect the AI system is operable without continual communication signal feedback and is configured to sense a state of the communication system and self correct for impairments, based in part on the sensed state.

In a general aspect, the present matter provides an AI system and method for linearizing a transmitter chain in a communication system, using a predistortion actuator that does not entail typical adaptation feedback signals (e.g., feedback signals coupled from the transmitted signal) during operation of the communication while correcting for transmitter characteristics that vary over time and operating conditions, where changes in operating conditions introduce impairments affecting transmitter characteristics.

In a further aspect, the present matter provides method, system, and apparatus for determining and implementing a predistortion model that takes into account, and is operable over, an entire selected signal operating range of the transmitter, while simultaneously taking into account different and changing operating conditions of the transmitter, such as, environment, load, signal parameters, transmitter parameters, and operating parameters across the entire operating range of the transmitter. Furthermore, the model is developed to use a single set of DPD coefficients across this operating range of the transmitter, thus avoiding typical adaptation feedback signals, and multiple stored sets of coefficients or dynamic re-computation of coefficients.

In a still further aspect, different and changing operating conditions may be provided by various sensors or derived from the input signal. An advantage of this may be seen with respect to a specific example of multi antenna systems where typical feedback signals are taken by a receiver antenna placed in the antenna radiation field, which may introduce unwanted impairments in the transmitted signal.

In accordance with an embodiment of the present matter there is provided linearizer for a transmitter, comprising an input interface for inputting linearizer signals comprising information carrying signals, and parameter signals, other than the information carrying signals, representing metrics affecting transfer characteristics of the transmitter, over an operable range of the transmitter and a predistortion actuator circuit configured with a predistortion model for predistorting at least part of the information carrying signal to produce predistorted signals, the predistortion model being configured to be operable for adaptation to varying input linearizer signals over an entirety of the operable range of the transmitter using a single set of model coefficients that are unchanged over the entirety of said operable range.

In a further aspect the linearizer may be applied to a phased antenna array (PAA), for example a MIMO transmitter chain, for a wide range of beam steering directions for adaptation of its DPD functions to transmitter's settings, operating and environmental conditions, while reducing dependence on real-time synthesis or computation of predistortion actuators for every beam direction angle, and the above-mentioned settings and conditions.

In another aspect the linearizer references a steering angle as an input data parameter to a synthesise a single DPD model which may be used to generate predistorted data for application to a wide range of beam directions, rather than synthesising multiple DPD models corresponding to different beam direction angles.

The present matter advantageously provides a MIMO DPD for linearizing a transmitted signal across a range of beam steering angles by reducing the number of DPDs to at least one DPD covering a two-dimensional (2D) surface of subarrays in phased array antennas, wherein the at least one DPD may linearize the beam across a range of azimuth and altitude angles, even when PA in each subarray may exhibit different behaviors.

In a further aspect the DPD actuator distorts an input signal of a phased array transmitter based on azimuth and elevation values of the steering angles using only one DPD actuator for a range of designated beam directions.

In a further aspect the DPD actuator distorts a plurality of input signals of a multi-beam MIMO transmitter based on azimuth and elevation of the beam's steering angles using only one DPD actuator for a range of MIMO transmitters settings.

In a further aspect the DPD actuator distorts the signal based on azimuth and elevation of a steering angle using only one DPD actuator for a range environmental condition.

In a further aspect the DPD model may be Volterra series based, analytical based, neural network based, or data based.

In a further aspect the DPD actuator for a given sub-array, in a multi antenna, multi-user applications input a steering angle of neighbouring subarrays during DPD training of the system.

In a further aspect the DPD actuator for a given sub-array inputs transmission power as an input to the DPD to distort the signal.

In a further aspect the DPD actuator for a given sub-array inputs the state of the impedance matching between the outputs of the power amplifiers and the antenna elements.

In a further aspect the DPD actuator for a given sub-array inputs the system temperature as an input to the DPD.

In a further aspect a feedback circuit may be selectively activated to capture and estimate the beam signal transmitted to derive the DPD model parameters, preferably the selective activation may be during periods when the transmitter is not actively being operated with users.

In a further aspect the feedback signal may be based on near-field measurements, far-field measurements or through signal couplings within the transmitter chain before broadcasting the signal over the air in a given direction.

In another aspect there is provided a method for a linearizing a transmitter comprising comparing samples of the input signal and samples of output signal of the transmitter over different operating conditions and using said comparison to generate a single set of coefficients for a predistortion model for the linearizer, wherein the single set of coefficients is operable with the model for adaptation to varying input signals over an entirety of said operating conditions of the transmitter.

In another aspect the method includes configuring a predistortion actuator circuit with the predistortion model for predistorting at least part of the information carrying signal to produce predistorted signals, in response to the information carrying signals and parameter signals, other than the information carrying signals, representing metrics affecting transfer characteristics of the transmitter, over an operable range of the transmitter.

In a further aspect the linearizer method and algorithms may be configured in digital signal processor, applications specific integrated circuit, field programmable gate array, an integrated circuit, or software library or program for configuration of a processor to execute the linearizer functions described herein.

In a still further aspect there is provided a linearizer for an optoelectronic transmitter comprising: a DPD actuator for predistorting an input information signal to generate a predistorted signal, an optical modulator for generating a modulated optical signal responsive to an electrical signal, being a representation of the predistorted signal, an optical channel for carrying said modulated optical signal, and a radio-frequency amplifier for amplifying an electrical version of said predistorted signal extracted from said carried modulated optical signal, and wherein the DPD actuator is configured to be operable for a selected range of operation of the optoelectronic transmitter with a single set of DPD coefficients.

In a still further aspect, the optical modulator includes an optical source for generating an optical carrier.

BRIEF DESCRIPTION OF DRAWINGS

Embodiments of the present matter will be described by way of example only with reference to the accompanying drawings, in which:

FIG. 1b shows a block diagram of a linearizer architecture for a transmitting system according to the prior art;

FIGS. 11a and 11b shows generalised block diagrams of a linearizer for an optoelectronic radio-over-fiber transmitter according to embodiments of the present matter.

DETAILED DESCRIPTION

Figure 1A:
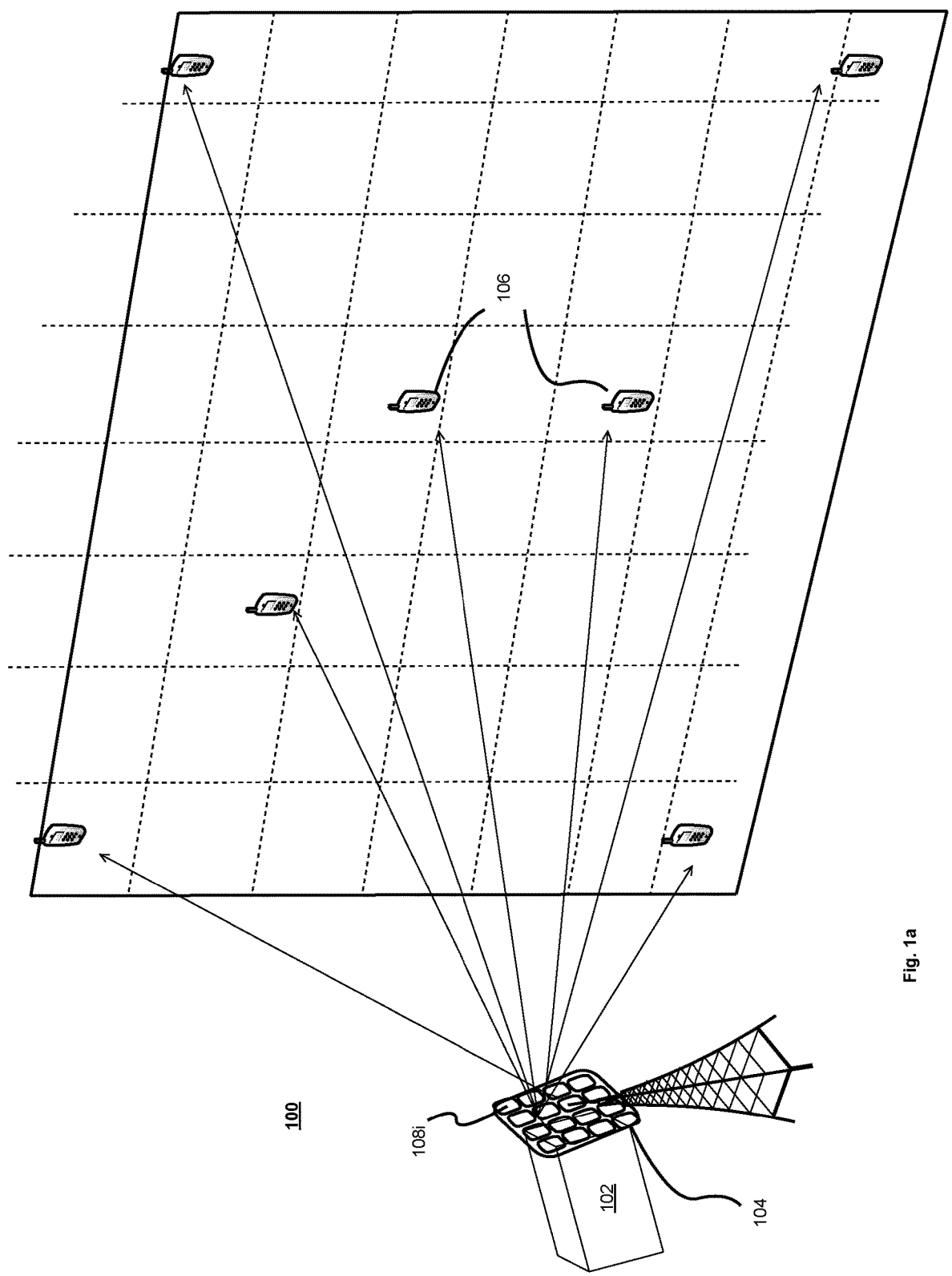
FIG. 1a shows a perspective view of a generalised multi antenna system deployed as part of a typical mMIMO system.

Aspects of a linearizer according to the present matter are exemplified by the following description and with reference to the drawings. Repetitive description and of like elements employed in on or more embodiments described herein is omitted for sake of brevity. Like elements in the drawings are indicted by identical reference numerals.

In communication systems with multiple different parameters contributing to multiple impairments, where distortions are introduced to the transmission signals, current predistortion architectures are inefficient at linearizing such systems. As for example, MIMO (including mMIMO) beamforming transmitters where these parameters include different beam directions at different operating conditions, environmental conditions, signal settings and transmitter settings. For clarity, in the following description, a signal generally refers to values that have amplitudes and/or phase that vary over time or space or both, and which may carry information to be communicated by the communication system, while a parameter represents a value or signal that affects the communication system behaviour, and which in some instances may also vary over time and space as the system behaviour changes.

One challenge in predistortion systems is the development of a predistortion model for a linearizer that operates in an efficient manner on multiple input conditions (including functions derived from, or values indicative of those conditions) that have an impact on a transfer characteristic of a transmission chain over a range of operating conditions. Typically, coefficients associated with a PA model require frequent recalculation in response to changes in PA characteristics based on changes in the input electrical signals. Changes to the PA characteristics may also take into account a limited number of operating and environmental conditions, typically limited to no more than one, and which are constrained to being directly associated with the input electrical information signal.

An advantage of the various embodiments of the linearizer systems, methods, apparatus, and algorithms described herein is that the linearizer according to embodiments of the present matter provide an adaptable DPD that compensates for, in addition to an input electrical information signal, effects of an unlimited number of different input and operating conditions on a PA/transmitter transfer characteristic.

A further advantage of the linearizer according to aspects of the present matter is that it is configurable to be deployed in a beam-direction aware MIMO system by incorporating azimuth and elevation angles of a beam as well as subarray identification to generate predistorted signals in an intended beam direction. Furthermore, the MIMO DPD modeling approach includes the azimuth and elevation angles of the beam direction as a part of the input data including transmitter settings, environmental conditions, and signals parameters. The linearizer according to embodiments of the present matter may also consider cross-coupling effects, between antenna elements and within MIMO transmitter branches, as a function of both the input signal and the beam steering angle.

A further advantage of the linearizer according to aspects of the present matter is the reductional in computational burden on one or more of a DPD actuator, hardware resource usage, and radio base station power consumption requirements.

A still further advantage of the linearizer in accordance with aspects of the present matter is that a functional DPD model may be derived or estimated in the field with at most a single processing of the transmitter chain, and thereafter programmed, in an example FPGA/ASIC, for immediate operation in real-time/online. Thus, reducing overall time, and cost from linearizer training to deployment.

Another advantage of the linearizer according to aspects of the present matter is to obviate real-time adaptation apparatus for updating the DPD model for short term changes in operating conditions, or changes in transmitter settings, such as traffic and environmental conditions. The linearizer according to aspects of the present matter may however be configured to be adaptable to long term, dramatic changes in operating conditions, or environmental conditions.

Another advantage of the linearizer according to the present matter is that the DPD may be implemented with artificial intelligence (AI) processing which may be model agnostic and independent of the architecture and semiconductor technologies used in the PA and transmitters. Further the AI implementation in the DPD may be configured to implement modeling and processing algorithms such as artificial neural networks (NN), Convolutional Neural Networks (CNN), analytical based models and Volterra-series-based models.

As is know a linearizer incorporates a DPD model. Generally, two steps are important for realizing DPD. One is to model the PA. The other is the identification algorithm of the predistorter. DPD modeling usually starts with a training phase. An initial goal of which is to obtain input and output data to generate a suitable discrete time-domain model structure representing multiple inverse functions $H^{-1}$ of the transmitter chain. Recall that in DPD, using an example SISO implementation to illustrate without loss of generality, if x(n) is to be broadcast through a PA with the PA having a discrete time-domain transfer function H(n) and output signal y(n); it is the goal of DPD to find an approximate inverse transfer function of the PA, $H^{-1}$, with output x̃(n), so that the output of the PA is an linearly amplified version of the original input y(n)=G.x(n)=H(x̃(n)) where G is a complex representing the gain of the PA. PA models may be classified into memoryless models and models with memory. Different forms of mathematical representations of the transfer function may be defined, examples being neural networks, polynomial functions to name a few. For ease of understanding in this discussion we assume a memory polynomial form for the PA's non-linear operator, $f(x(n), \ldots, x(n-m))$, then, $$y_{MP}(n) = \sum_{k=0}^{K-1}\sum_{m=0}^{M-1} a_{km} \cdot x(n-m) \cdot |x(n-m)|^k$$

where:
x(n) is the PA input
$y_{MP}$ is the PA output
$a_k m$ are the PA polynomial coefficients
M is the PA memory depth
K is the degree of PA non-linearity
n is the time index The input x(n), the output y(n), and the coefficients $a_{km}$ are complex valued. If the DPD model is an inverse non-linear function of the PA, $f^{-1}(x(n), \ldots, x(n-m))$, then, $$x_{MP}(n) = \sum_{k=0}^{K-1}\sum_{m=0}^{M-1} d_{km} \cdot y(n-m) \cdot |y(n-m)|^k$$

where the $x_{MP}(n)$ is the predistorted signal. Note that y(n) may be normalized by the linear gain G of the PA. To solve for the DPD coefficients, $d_{k,m}$ we rewrite the above equation as a set of p linear equations. Where increasing the number p of linear equations amounts to increasing training buffer size and increasing M and K corresponds to increasing the DPD model complexity. These values are usually chosen at design time, and if the PA has significant memory requirements, offsetting y in time before deriving the coefficients may be required.

Continuing with the example, a linearizer for a SISO system is usually implemented with this polynomial DPD model derived by either direct learning architecture (DLA), or indirect learning architecture (ILA) to identify the set of model coefficients during operation to dynamically drive the DPD to minimise an error between input signal x(n) an output signal y(n). Known algorithms may be implemented to compute an error signal in a feedback loop. The error is the difference between a measured and estimated value, such as the measured PA input and an estimated output of a cascade of the DPD model and PA. The algorithm attempts to drive this error to zero and in doing so converge on a best estimate of the DPD coefficients.

However, predominantly in the cases of MIMO, mMIMO and other active phased arrays, the transmitter chain is subject to many additional hardware and electrical impairments due in part to the active phased array transmitters, and mismatches between PAs, and not just a function of the input information carrying signal x(t). Coupling and crosstalk effects between antenna elements may alter impedance matching between elements, which in turn may modify the characteristics of each amplifier driving such elements. Coupling also changes with beam direction (usually relative to a plane of the antenna array). There are MIMO DPD, and beamforming DPD designs, such as beam oriented DPD with embedded feedback to linearize the transmitter. With mMIMO these effects are further exacerbated by adjacent subarrays introducing additional in-band distortion. With highly beam direction dependent systems where beam angle is non-constant with extremely short settling times, in the msec range, as for example specified in the 5G standard, and where the coupling effects vary with beam direction, typical beamforming DPD models, adapted from the SISO paradigm, such as memory polynomials, Volterra series, lookup tables (LUT), and neural networks, all have limitations. Furthermore, power control of the PA, because of changes in a signals average power to accommodate a user's distance away from a transmitter, may significantly alter non linearities in the transmitter. Typical DPD models do not take this parameter into consideration.

Referring to FIG. 1a there is shown a generalised multi antenna system 100 deployed in a typical mMIMO system. The system 100 includes a base station (BS) 102 coupled to an antenna array 104. In operation the BS 102 establishes a spatial down link (DL) connection between a plurality of user equipment (UE) 106 mobile stations in space. The BS is capable of transmitting radio signals to the UEs 106 and receiving Up link (UP) signals transmitted by the UEs. The DL connection is a communication channel to the respective UE's 106 located at different azimuth angles and elevation angles relative to the BS 102.

The system 100 is configured so that the BS 102 provides bidirectional high-speed reliable connections to the UE's 106 by employing MIMO radio transceivers in the base station 102 coupled to the antenna array 104 configured to be a phased array antenna (PAA), also termed an active array, for dynamically adapting the radiation pattern in real time to follow respective UE's 106. The active PAA is composed of many compact radiating elements 108i, (i=1 . . . N) where N is several hundred, embedded in a common substrate. The coupling effects between antenna elements and radiated signals in this type of active PAA are significant due in part to small spacing between radiating elements. The coupling effects result in variation in the transceiver behaviour not only as function of an input signal to the transceiver but also beam steering direction. For example, if there are N UEs being served by the PAA, then a linearizer employing DPD must linearize a main radiation lobe directed to each of the N UEs, such that, N modulated data signals are sent using respective ones of N subarrays to respective ones of N users in different directions. Typically, a two-dimensional (2D) grid of DPDs may be employed in the BS to linearize the beam at any given steering direction. For example, FIG. 1b shows a block diagram of such a prior art linearizer configuration 120. However, this 2D grid type implementation is practically prohibitive, particularly for in-field applications. And furthermore, the configuration 120 is unfeasible when taking multiple operating conditions into consideration. For example, each of the DPD actuators has a corresponding bank of DPD model coefficients, resulting in multiple sets of DPD actuators, and corresponding coefficients, each set for a corresponding operating condition of the system.

According to embodiments of the present matter there is provided a system, method, and software algorithm for configuring a single DPD for linearizing signals deployed in for example the PAA 104. As may be appreciated, a single DPD may be more feasible and practical for MIMO and mMIMO applications and obviates much of the DPD implementations thus far. Assuming that the size of the massive MIMO antenna array contains N antenna elements grouped in P sub-array, the system includes P transmit chains, and in a hybrid beamforming array based on the sub-array connection architecture, each transmit chain generates N/P (N divided by P) radio frequency signals to drive antenna elements. Each sub-array generates a beam to transmit signals of a corresponding transmission DL, so that a hybrid beamforming array based on a sub-array connection architecture may be composed of a plurality of active phased arrays. Similar challenges and problems arise in the uplink (UL) communication between the UE and the BS when UE terminals when configured in particular with beam-forming and phased array transceivers. Embodiments of the present matter, while for brevity are described with respect to DL and BS communication, are equally applicable to UE's and UL communications in general.

Figure 2:
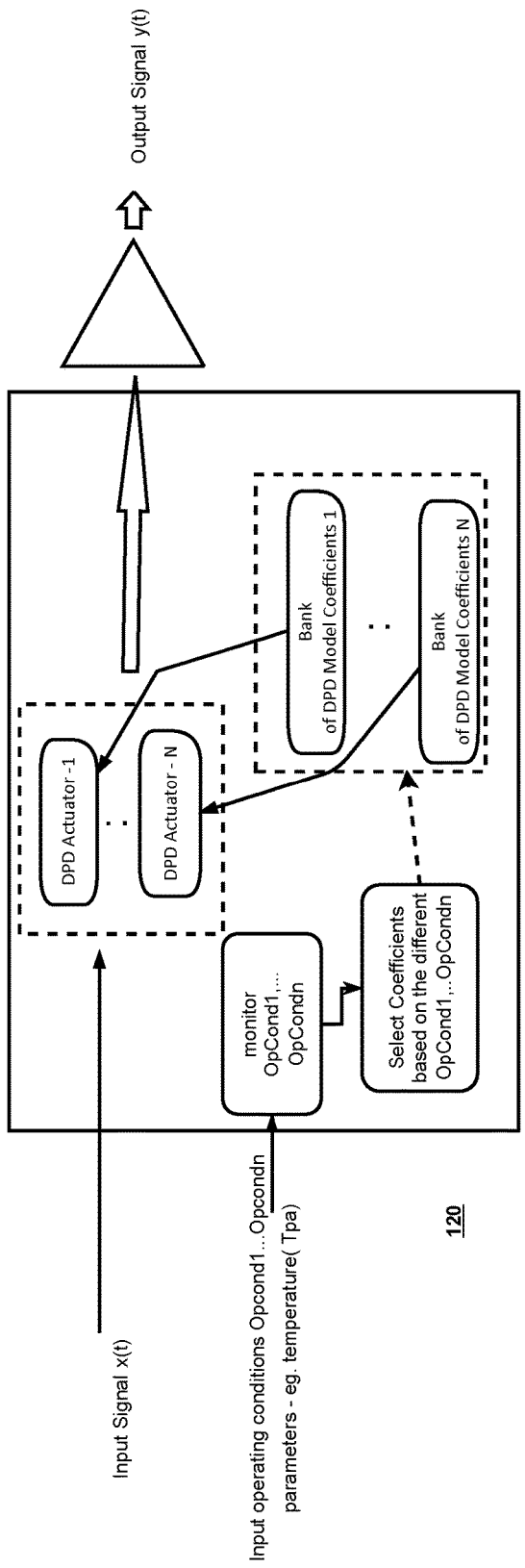
FIG. 2 shows a block diagram of a linearizer architecture according to an embodiment of the present matter.
Figure 2:
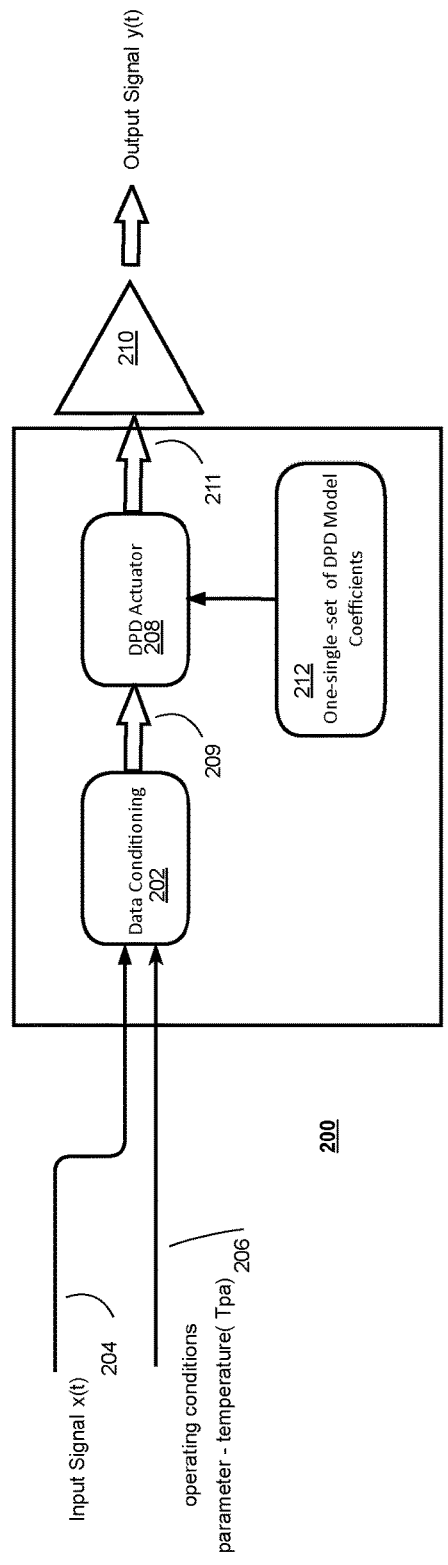

Referring to FIG. 2 there is shown a block diagram of linearizer architecture 200 according to an embodiment of the present matter. In the embodiment 200, and for ease of understanding, the linearizer is illustrated deployed in a SISO system with an input signal x(t), the at least one operating condition parameter input 206 being for example, a temperature $T_{pa}$ signal provided by a sensor (not shown) from the PA 210 (it is known that the PA behaviour characteristics change with temperature). The linearizer 200 includes a data conditioning and fusion block 202, having signal inputs for receiving an input signal 204 encoding information to be transmitted, and operating conditions inputs for receiving operating conditions parameters 206, a DPD actuator 208 coupled to the data conditioning and fusion block 202 to receive preconditioned signals 209 and produce in response thereto an output predistorted signal 211 to a PA/transmitter 210 by using a single set of DDP model coefficients 212 over an entire operating range of the linearizer.

In order to construct the DDP actuator 208, a training phase is executed. Training is based on a selected predetermined form of a transfer function for characterising the PA 210 (or transmission chain). A discrete time-domain model of the DPD actuator 208 (based on the predetermined form of the transfer function) is trained with samples x(n),y(n) taken at discrete times over a range of the input x(t) signal 204 and output signal y(t), along with corresponding samples of the operating conditions parameter 206, which in the illustrated embodiment is temperature $T_{pa}(t)$. Regardless of the form of the inverse transfer function that is chosen, the function is solved to find a single set of coefficients (single vector or matrix) 212 that satisfies the entire predetermined range of operation for the linearizer. The data conditioning and fusion block 202, applies a scaling or adjusting, as appropriate, to the operating conditions parameter (temperature in this example) to ensure that the single set of DPD model coefficients 212 may be found which is applicable to the entire operating range. In other words, if the transfer function is based on, for example, a memory polynomial model, then embodiments according to the present matter generate a single memory polynomial model having the a single set of coefficients for a given range of temperatures $T_{pa}$ (min to max).

In an operation phase the DPD model is configured in the DPD actuator 208, the data preconditioning block 202 passes the input signal 204 and the preconditioned temperature signal 206 to the DPD actuator 208. The predistorted signal being generated by the DPD actuator 208 by applying the preconditioned signals 209 containing the input signal 204 and operating condition parameters 206 (scaled if appropriate) to the inverse transfer function model with corresponding pre-generated set of DPD coefficients 212 of the PA/transmitter 210 to be linearized.

It merits noting that, in typical DPD architectures changing operating conditions, changes basis functions, which in turn require changing of corresponding model coefficients. Based in the example above, coefficient values would be different for the different input signals at the different temperature levels (i.e. different operating conditions). In other words, multiple different sets of coefficients (which is typically stored in a database or memory) and basis functions are required over a selected operating range of the transmitter. For example, as shown in FIG. 1b, coefficients would be extracted at each different temperature level separately and linked to the signal changes. The coefficients values would have to be continually updated according to the input temperature levels on operation. With any change in the system conditions such as temperature, signal's average power, new DPD coefficients would have to be re-identified before being applied by the DPD actuator.

In the embodiment of FIG. 2 the linearizer 200 considers a single operating condition parameter, namely the ambient temperature. The linearizer 200 described herein may be deployed in any number of different configurations of a transmission system, such as mMIMO illustrated in FIG. 1, SISO, MIMO, and multiband MIMO, optoelectronic radio-over-fibre transmitters, satellite communications for both terrestrial and space segments, wireless digital video broadcasting, cable transmission networks. Furthermore, the PA behavior may also be affected by other input parameters too. Previous methods are not extendable to accommodate more input parameters to the DPD architecture. The functionality of the linearizer 200 may be applied to embodiments having a plurality of different operational parameters. For example, PA behavior is a function of PA average power and junction temperature. However, the PA junction temperature may not be readily accessible. The PA junction temperature is itself a function of average PA power and ambient temperature. Therefore, both operating conditions of average power and ambient temperature may be considered, for accurate prediction of the PA distortion for different scenarios. The training phase of the linearizer is described in greater detail below.

Figure 3A:
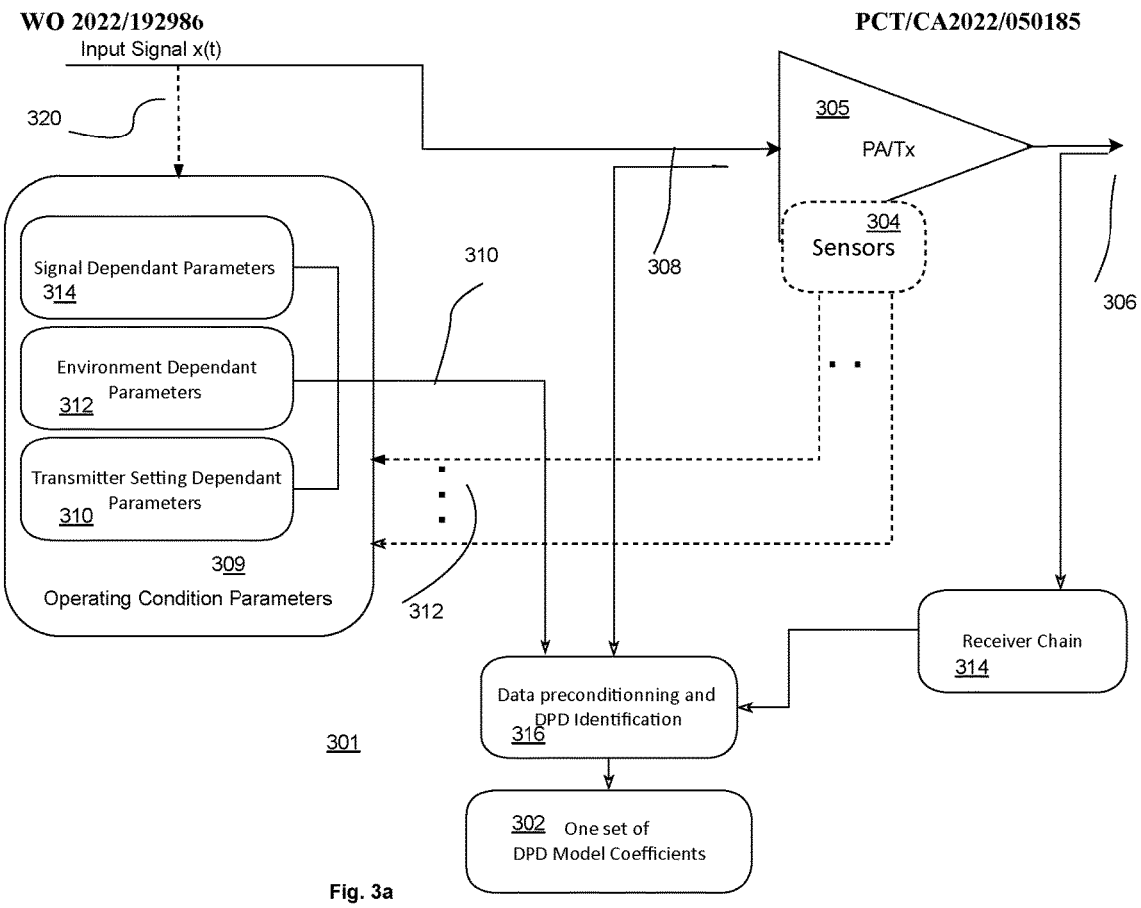
FIGS. 3a and 3b show a training configuration, and operational configuration, respectively for a generalised linearizer according to an embodiment of the present matter.
Figure 3B:
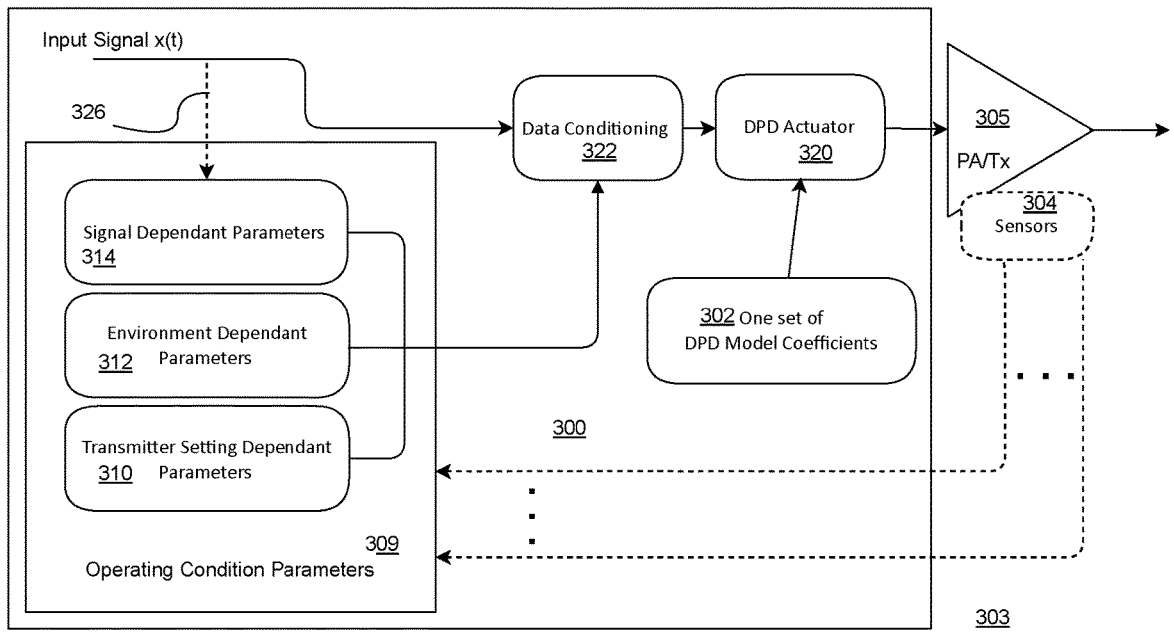

Referring now to FIGS. 3a and 3b there is shown a training configuration 301, and operational configuration 303, respectively for a generalised linearizer 300 according to an embodiment of the present matter. The linearizer 300 is like the single parameter linearizer 200 illustrated in FIG. 2 but additionally configured to include an extended number of operating conditions, according to a further embodiment of the present matter. As before, the lineariser 300 is first trained on a PA/transmitter 305 to be linearized, on which the linearizer will eventually be deployed. The linearizer 300 includes, for both the training and operational phases, an operating condition parameter block 309 for inputting a plurality of operating conditions, identified as factors that affect the characteristics of the PA/transmitter 305. The operating conditions parameters 309 includes a plurality of inputs which may be notionally grouped by their origin as follows: signal dependant parameters 314 comprising, but not limited to, signal average power, the signal bandwidth, the signal peak-to-average power ratio (PAPR) etc.; environment dependent parameters 312 comprising parameters that describe the transmitter operational environment, such as ambient temperature etc.; transmitter settings parameters 310 comprising parameters that are specific to the transmitter operating conditions, such as, beam azimuth, and elevation angles usually set by phase shifters in an active array (not shown), mismatch between the amplifiers and the antenna's elements often modelled using the signal reflection coefficient, F, the cross coupling between the antenna's elements, the biasing voltages of the amplifiers etc. In addition to the operating condition parameter block 309, the input signal x(t) 320 may also be captured by the block 309, which may include a sample x(n) of the signal to be transmitted and a delayed olderversion of the signal x(n–m). In some embodiments the signal sample may be used as an index to a set of corresponding operating condition parameters.

Training is implemented based on input data (including both the operating conditions 309 and the input signal 320), and output data 306 over a range of operating conditions of the PA/transmitter 305, to obtain a suitable discrete time-domain model structure for the DPD (as explained in more detail below). Assuming for example, that the transmitter is to be deployed in the base station 102, then during training suitable input data, and output data is captured at discrete points across a complete steering-angle range, while the PA/transmitter is submitted to different environment conditions that affect the PA/transmitter 305 characteristics. In embodiments according to the present matter, the signal dependent parameter block 314 inputs information signals 320, which may include but not limited to, one or more of, I(n), Q(n) and the magnitude |x(n)| and $|x(n)|^2$, transmitting angle of antenna subarrays samples, the steering angle values θ(n), and voltage standing wave ratio (VSWR); the environment dependent parameters block 312 inputs sensor data 304 from the PAs representative of the PA operating conditions (which may also include array conditions), including one or more of the PA thermal variations such as temperature (self heating effects), ambient temperature, PA power (and average power variations), voltage, and current amongst others; and the transmitter settings dependent parameters 310 may include one or more inputs of the PA settings.

A data preconditioning and DPD model identification block 316 is provided for processing the input and output data samples. The block 316 receives as inputs: a first feedback signal 306 from the output y(n) of the PA via a receiver chain 314; a second feedback signal 308 from the signal applied to the transmitter chain (PA/Tx 305); and input parameters from the operating condition parameters block 309. The DPD identification block 316 includes a predetermined form of the inverse transfer function for the radio chain. The role of the DPD identification block 316 is to derive a single set of model coefficients that minimise errors between the input and output signals for a range of input data conditions wherein the input data conditions include a combination of the input signal and the operating conditions parameters 309. The data preconditioning function block 316 applies scaling of one or more of the values of the input operating condition parameters to ensure that in most instances across the range of training a common single set of model coefficients is generated. It may be worth noting that the predetermined form of the inverse transfer function may be represented by one or more of combination of a neural network, a generalised memory polynomial, memory polynomial and a look up table.

Regardless of the form of the transfer function chosen, the DPD identification block 316 trains a model that results in a unique single set of model coefficients that are valid for all these operating conditions and over a range of operating conditions of the transmitter and that will eventually be deployed in the DPD actuator.

Referring now to FIG. 3b there is shown the generalised linearizer 300 deployed in an operational configuration according to embodiments of the present matter. The deployed linearizer 300 includes a DPD actuator 320, a data conditioning and fusion block 322, the set of DPD coefficients 302 and the operating conditions inputs 309. The DPD actuator 320 applies the single set of coefficients generated during the training phase described in FIG. 3a. Recall that this set of coefficients 302 works for all input signals for which the DPD actuator 320 was previously trained. Recall further that the data conditioning block 316 may scale one or more of the input operating condition parameters 309, as in the training phase, so that the inverse transfer function applied by the DPD actuator 320 to the input signal x(t) matches the corresponding conditions that minimised the error between the input signal x(t) and output signal y(t) during training. It may be seen that the coefficients do not need to be updated, rather it is the combined input signal and the conditioned operating parameters that are used by the DPD actuator 320 along with the single set of DPD coefficients to generate the predistorted signal. Further it may be seen that the linearizer 300 according to some embodiments, may not require a feed back signal during operation, nor does the linearizer require the coefficients for the DPD actuator 320 to be continually recalculated during operation. In some instances, however, for example component drift with the passing of time (aging), major environmental condition changes, a re-update of the DPD model may be undertaken by retraining and identifying of a new or updated DPD model. Several examples of different DPD actuators that may be implemented in the linearizer according to embodiments of the present matter. One or more of the different actuators may be applied to linearization. For example, artificial intelligence DPDs like artificial NN, CNN or Deep Neural Network (DNN) may be applied in power amplifier modeling. Other approaches may include Lookup Tables (LUT) based models, box-based models such as Hammerstein and Wieners models or analytical based models such as Saleh models or Volterra series-based models like memory polynomials to model the MIMO beamforming radio transmitter.

For training the DPD identification block 316 is used to estimate the DPD model coefficients 302. Embodiments of the present matter employ versions of the earlier mentioned two different approaches: ILA and DLA. In the ILA, a post-distorter is assumed. The inputs (PA output) and outputs (PA input) of the model which constitutes the post-distorter are known. The post-distorter may be identified by using either a least squares (LS) algorithm, a least mean squares (LMS) algorithm or a recursive least squares (RLS) algorithm. Then the post-distorter is copied as the predistorter. In DLA, a PA model is first extracted and then the DPD model identification is performed to fit an inverse of the PA behavior. The predistorter is obtained based on a reference error between the output of the PA model and the input signal. Non-iterative such as LMS technique or iterative identification algorithms may be implemented, such as nonlinear filtered-x LMS (NFLMS) algorithm and nonlinear filtered-x RLS (NFRLS) algorithm.

Figure 4:
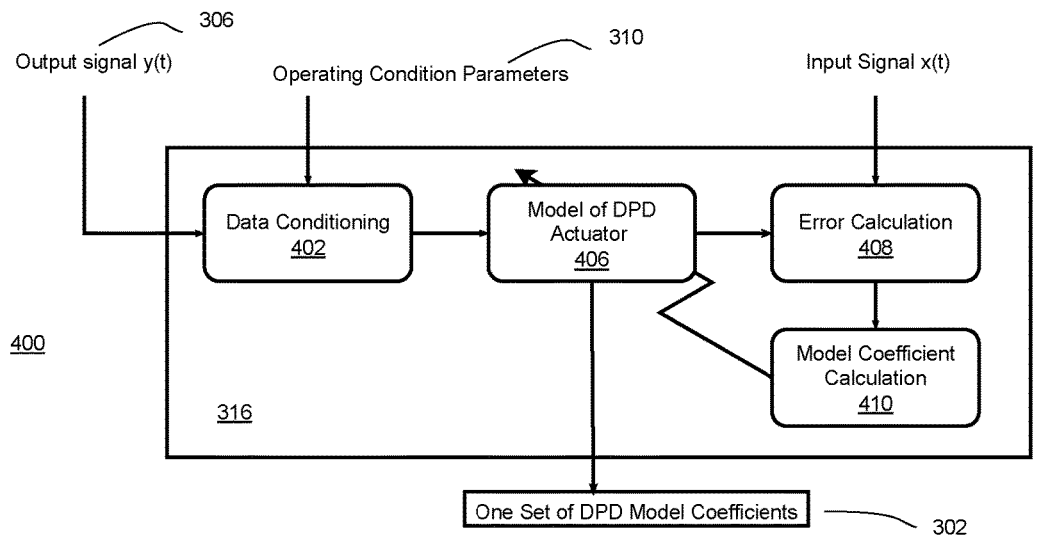
FIG. 4 shows an IDLA's architecture and method for training a DPD identification block for estimating the DPD model coefficients, according to an embodiment of the present matter.

Referring to FIG. 4 there is shown an ILA and method 400 for training the DPD identification block 316 for estimating the DPD model coefficients 302, according to an embodiment of the present matter. In the ILA architecture a post-inverse block of the PA is first identified using the input signals, the operating conditions parameters, and the output signal of the PA, and then applied upstream of the PA as a DPD. The block 316 includes data preconditioning block 402, which receives the output signal y(t) 306, operating condition parameters signals 310 and applies a conditioned version of both signals to a DPD actuator block 406 which is implemented with a predetermined form of the DP function. An error calculation block 408 compares the predistorted output signal of the model DPD actuator block 406 with an input signal x(t) to generate an error signal, which is used in turn by the model coefficient calculation block 410 to compute a set of coefficients which are applied to the DPD actuator 406. The sequence of steps may be performed recursively until a suitable error condition is achieved over the range of operation. In which case the set of DPD coefficients for the model is determined 302.

Figure 5:
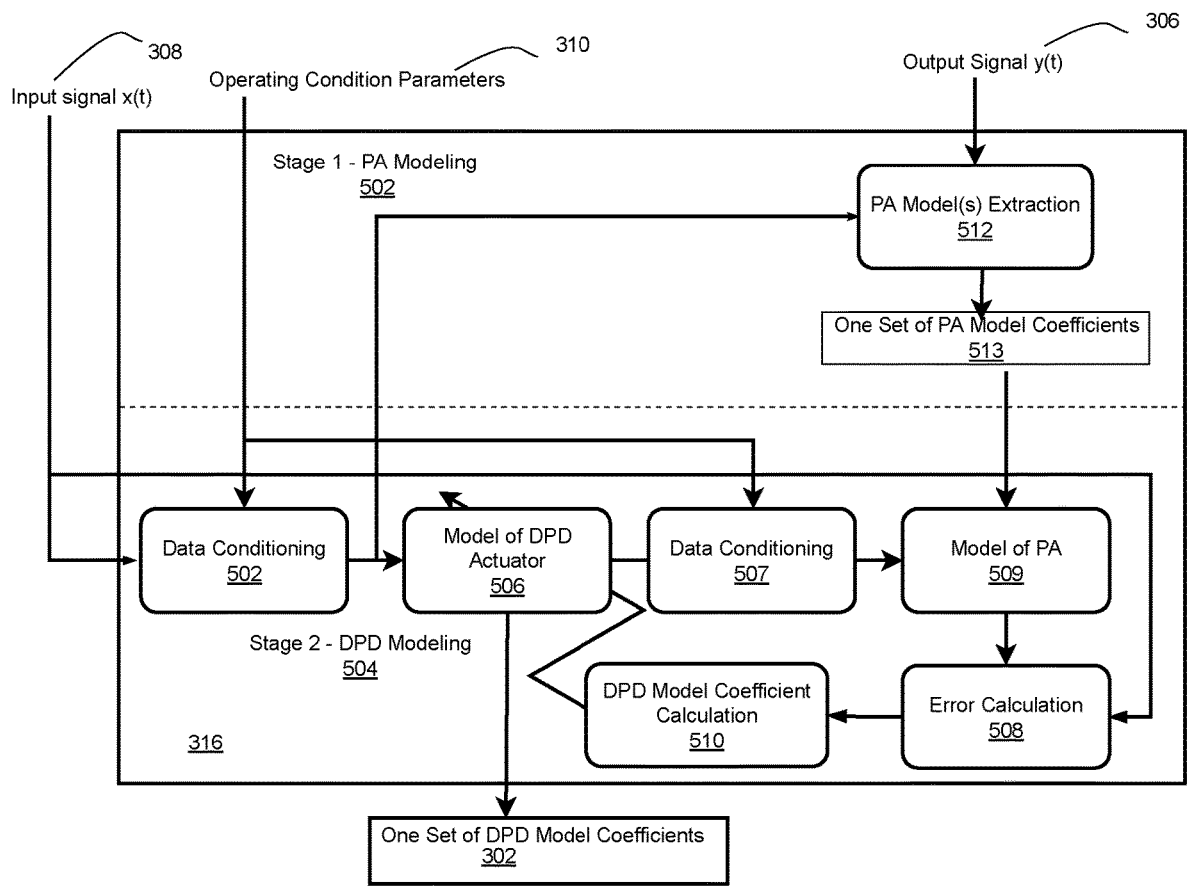
FIG. 5 shows a further DLA's architecture and method for training the DPD identification block to estimate the DPD model coefficients, according to another embodiment of the present matter.

Referring to FIG. 5 there is shown a further DLA and method 500 for training the DPD identification block 316 to estimate the DPD model coefficients 302, according to another embodiment of the present matter. In the DLA configuration 500, the DPD is directly identified with the input and output signals of the system. The DLA configuration 500 comprises two stages; a first stage for modelling the PA 502, and a second stage 504 for modelling the DPD actuator. The block 316 includes the data preconditioning block 502, which receives, in the first stage of modelling 502, the input signal x(t) 308, operating condition parameters signals 310 and applies a conditioned version of both signals to a PA model extraction block 512. The PA model extraction block 512 uses the signal 510 from the data conditioning block 502 and the PA output signal y(t) 306 to generate a set of PA model coefficients 513 based on a predetermined form of the predetermined form of the PA characterising function.

In the second stage of modelling 504, the block 316 further includes a DPD actuator block 506 which is implemented with a predetermined form of the DPD function, similar to the PA model 512, a data conditioning block 507 for applying the PA data conditioning from the first stage to the model of the PA 509 (the PA model uses the set of model coefficients 513). An error calculation block 508 compares the predistorted output signal of the PA model block 509 with an input signal x(t) to generate an error signal, which is used in turn by the model coefficient calculation block 510 to compute a set of coefficients which are applied to the DDP actuator 506. The sequence of steps may be performed recursively until a suitable error condition is achieved over the range of operation. In which case the set of DPD coefficients for the model is determined 302.

Figure 6:
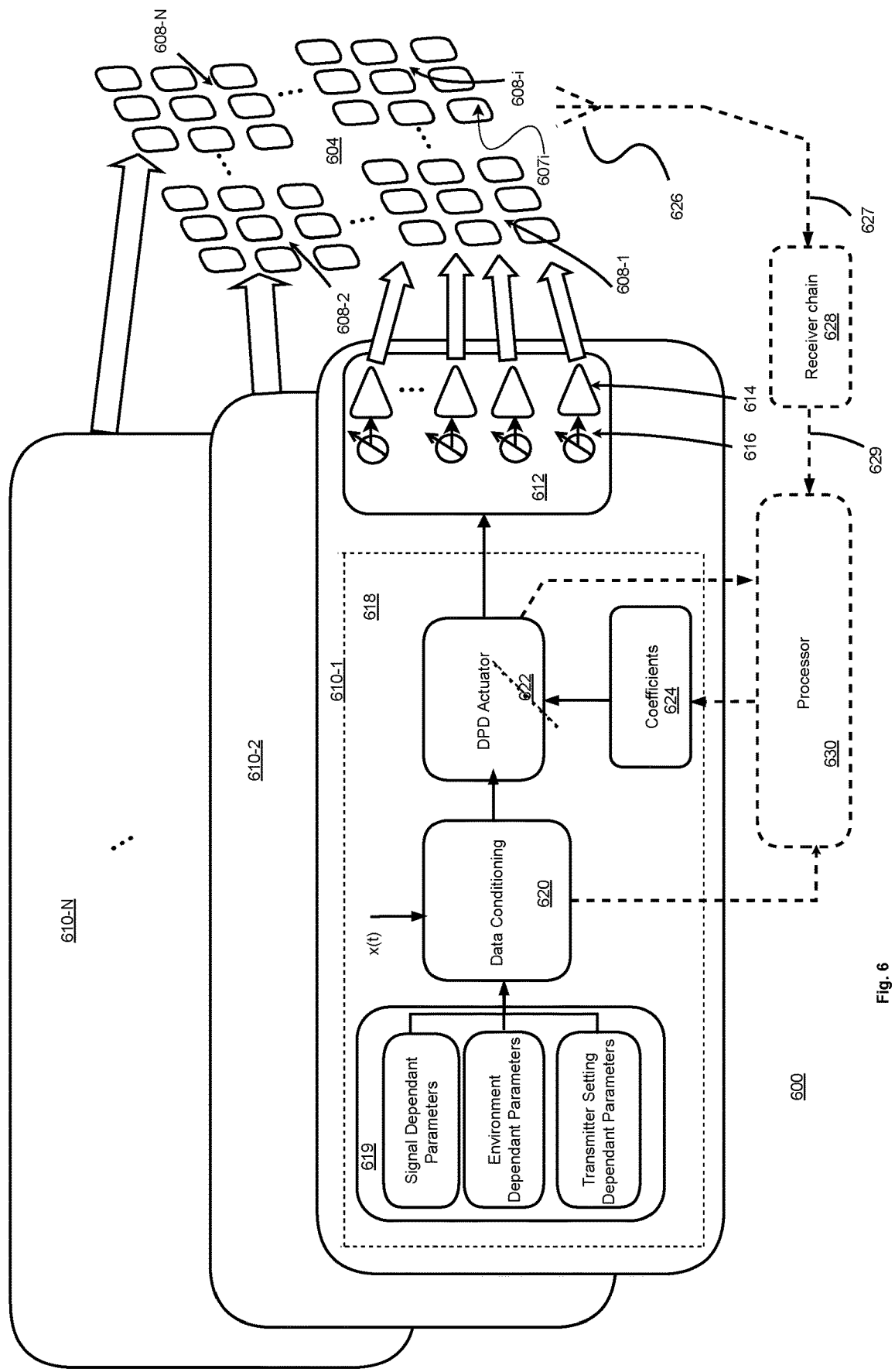
FIG. 6 shows a linearizer architecture for a mMIMO system according to an embodiment of the present matter.

Referring now to FIG. 6 there is shown a linearizer architecture for a mMIMO system 600 according to an embodiment of the present matter. Similar to the mMIMO system 100 illustrated in FIG. 1, the mMIMO system 600 includes an antenna array 604 comprising a plurality of antenna sub arrays 608-1, 608-2, . . . 608-x . . . 608-N, each subarray being composed of a plurality of antenna elements 607i (i=1 to P) each antenna sub array being driven by a respective one of a plurality of subarray transceivers 610-1, 610-2, . . . 610-N. Each of the transceivers comprising a transmission chain 612 having a plurality of PA's 614 for driving at least one of the antenna elements 607i in its antenna subarray 608-i, phase shifters 616 and attenuators (not shown) responsive to a steering direction and the reduction the sides lobes strengths respectively, and upconverter (not shown) for generating from baseband, RF signals to be applied to the PA's 614. According to embodiments of the present matter, each of the transceivers additionally include a linearizer 618 comprising an operating conditions parameters block 619 for inputting or updating a plurality of operating parameters of the transceiver, a data conditioning block 620, a DPD actuator 622 and DPD coefficients 624.

In operation, the DPD actuator 622 reads coefficients stored in the coefficient pool 624 and applies them to the conditioned data (based on input signal samples, base band in this embodiment, and operating conditions parameter samples) output from the data conditioning block 620 to generate predistorted data. Recall that the format and type of conditioning applied to data by the data conditioning block is based on the form of the DPD function for the DPD actuator 622 chosen during a training phase. The predistorted data is converted via a transmission chain 612 and transmitted as RF signals from the sub arrays 608-i served by the subarray transceiver 610-i in the phased array antenna 604. In the transmission chain a beamforming coefficient vector (a complex number) is applied by multiplying the vector with each signal driving each antenna element, to form the signal for a given beam direction. This signal is input to the appropriate PA 614 for amplification and output to a designated antenna array element.

There is further illustrated in FIG. 6 a training configuration (shown with dashed lines) for the mMIMO system 600 according to an aspect of the present matter. In the illustrated configuration the mMIMO system includes a feedback antenna 623, coupled by a receiver chain 628 to a processor 630. As previously described in the generalized embodiment, a feedback signal from an output of the RF chain is used in training the linearizer. The feedback antenna 622 may provide a feedback signal serving the multiple subarray transceivers during training. The receiver chain 628 may be configured to include analog and digital sections, wherein the receiver antenna 626 applies a received input signal to the chain which is coupled via a low noise amplifier LNA (not shown) to a frequency down converter (not shown) driven by oscillator (not shown). The signal may be filtered and passed to an analog-to-digital converter (not shown) for further processing in digital domain. The digital domain (not shown) of the receiver chain 628 may include a complex conjugate filter to compensate for IQ imbalances and a phase corrector to phase align the received signal. The processor 630 may be configured to provide the functions of data preconditioning and DPD identification similar to the block 316 illustrated in the embodiments described earlier. In the present aspect of multiple arrays, training data is tagged with a subarray identification (ID) alongside other input signals to generate the predistorted signal according to the subarray ID. In this aspect, the DPD actuators 622 in each subarray transceiver 610-i may share a common set of DPD coefficients, with each subarray transceiver DPD actuator using the corresponding subarray ID in addition to the subarray transceivers operating parameters and signal inputs. In another aspect, an independent training sequence may be carried out for each subarray DPD, consequently the respective subarray DPD coefficients may be unique. For example, this may be achieved in a time-multiplexed manner.

In accordance with other aspects, the output of the DPD actuator 622, as well as a received feedback signal 629, may be input to the processor 630 to compute the DPD coefficients 624, for DPD calibration/training and recalibration (example due to aging, environmental or signal quality changes) as described earlier.

In accordance with a further embodiment of the present matter the antenna 626 may be located in a far-field or near-field to observe the transmitted RF signal and provide the feedback signal 627. In a further embodiment the feedback signal 627 may be generated through an RF coupling (not shown) from the different PA outputs before the antenna elements and passed to the receiver chain 628. The receiver chain 628 may include one or multiple receivers multiplexed in frequency, or time. Each receive may operate at a sampling frequency higher or equal to a Nyquist sampling rate, or at lower sampling rate and or lower bandwidth than the transmitted signal.

In a further embodiment, the processor 630 may be time multiplexed to estimate the DPD coefficients 624 for each subarray DPD actuator 622 during the DPD calibration/training process, thereby providing more efficient use of processing resources.

In a further embodiment, the feedback signal may be constructed by taking samples from all the branches of the MIMO transmitter before sending the signals to the antenna's elements and combine them following an anti-beamforming processing to obtain an equivalent signal received by a far field receiver of the beam-signal resulting from all the signals emitted by the phased array antenna. In such case, the samples from all the branches of the MIMO transmitter may be obtained through RF couplings from the different branches sampled before being applied to an element in the antenna and passed to a receiving chain. This receiving chain may include one or multiple receivers that may be multiplexed in frequency or time domain and each receiver may operate at a sampling frequency higher or equal to a Nyquist sampling rate, or at a lower sampling rate. When the feedback signal is constructed by sampling the signals before transmission in the air, an anti-beamforming processing section may be implemented to undo the beamforming function applied to the signals in the transmitter's branches before summing the sampled signals to form the feedback signal to be used to determine the DPD function.

Figure 7:
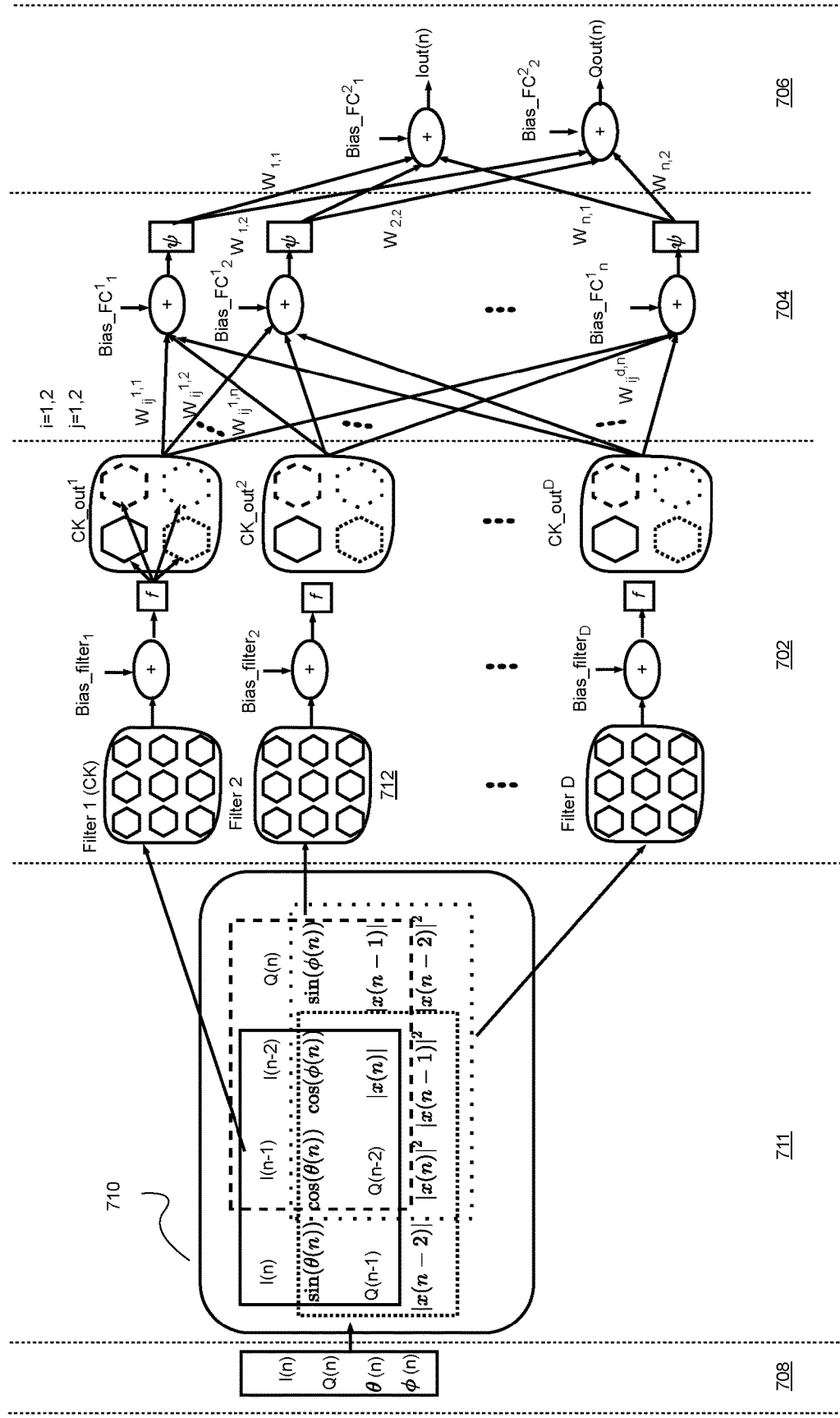
FIG. 7 shows a block diagram of a linearizer configured with an artificial NN model for implementing a DPD actuator, to linearize a PAA over ranges of azimuth and elevation angles ($\theta,\phi$) of the signal beam steering direction according to an embodiment of the present matter.

Referring to FIG. 7 there is shown a block diagram of a linearizer 700 configured with an artificial NN model for implementing a DPD actuator 320 shown in FIG. 3, according to an embodiment of the present matter. The form of the transfer function for characterising transmission chain is the artificial NN which may be classified into deep and shallow ones. The DNNs are NNs with more than three hidden layers. Shallower NN's have fewer layers and lower computational burden. The illustrated embodiment 700 is based on a shallow NN, although a deep NN may equally well be implemented according to another embodiment of the present matter.

For simplicity and without loss of generality, in the illustrated embodiment, a linearizer for a single beam, beam forming transmitter is described. The NN model 700 is based on a CNN structure, comprising a convolutional layer 702, followed by a fully connected NN layer 704, and an output layer 706. Input data to the NN 700 is derived from an input layer 708 for receiving time discrete samples I(n), Q(n), of a baseband I/Q signal (input signal 320) and steering angles θ(n) and φ(n) (operating condition parameter 309) of the beam forming transmitter. The input data is preconditioned (data preconditioning 322) and may be represented as a two-dimensional array of input data samples, referred to herein as an image 710, being notionally equivalent to an input image in a typical CNN.

Each image 710 comprises a set of element values of I(n), Q(n), the magnitude |x(n)| and the power $|x(n)|^2$ of the sample and, and delayed versions. Moreover, each image represents the data frame for specific steering angles (θ(n), φ(n)), and to provide information about the beam direction and the behaviour of the system, the cos(θ(n)), sin(σ(n)), cos(φ(n)) and sin(φ(n)) are included in the entries of the data image 710. Each image has an identification (ID) and may be coded with the θ(n) and φ(n). Furthermore, for each image an amount of memory captured, and the nonlinearity order are determined based on the characteristics of the type of PA being modeled. Both nonlinearity order and memory depth depend on the intrinsic characteristics of the PAs and signal bandwidth. Usually, Doherty amplifier may require more memory and nonlinearity order compared to class AB. Similarly, by increasing the bandwidth the memory effects increase consequently more memory terms are required for the linearization. Equation 1 describes the input image with $M^{th}$ memory depth and $N^{th}$ nonlinearity order. It may be noted that in the case of IQ Imbalances (|Q|) in a phased array transmitter, having both I(n), Q(n) of the input baseband signal provides the information for the model to form a complex conjugate of the signal and model the |Q|.

$$\text{Image}_i = \begin{bmatrix} I(n) & I(n-1) & I(n-2) & \cdots & I(n-m) \\ Q(n) & Q(n-1) & Q(n-2) & \cdots & Q(n-m) \\ \sin(\theta(n)) & \cos(\theta(n)) & \sin(\phi(n)) & \cos(\phi(n))0 \cdots & 0 \\ |x(n)| & |x(n-1)| & |x(n-2)|^2 & \cdots & |x(n-m)| \\ |x(n)|^2 & |x(n-1)|^2 & |x(n-2)|^2 & \cdots & |x(n-m)|^2 \\ & & \vdots & & \\ |x(n)|^n & |x(n-1)|^n & |x(n-2)|^n & \cdots & |x(n-m)|^n \end{bmatrix} \quad (1)$$

The convolutional layer 702 convolves the input data image 710 and pass the result to the next layer, the fully connected NN layer 704. Equation 2 describes an output of a $d^{th}$ convolving filter $\text{CK\_out}^d$ as a function of the $i^{th}$ input image, $\text{Image}_i$, the filter coefficients, $\text{Filter}_d$ and the bias, $\text{Bias\_filter}_d$. As described in Eq. 2, in the first stage, the input image is passed through pre-defined convolutional filters. These filters are convolving kernels (CKs) responsible for extracting the data features while reducing the data size for the downstream layers. The convolution operation on the input image 710 uses the $d^{th}$ CK 712 with a size of 3×3, resulting in convolved outputs $\text{CK\_out}^d$. The CK can operate with one-step stride-convolution step—or more depending on the system design. The parameters in this stage are the number of CKs and the CK size. The CK size is the number of rows and columns that each CK covers during a single convolution operation. The overall performance of the DPD depends on the number of kernels and the number of layers as well. However, with increasing the number of layers and the number of filters, the model complexity increases. Therefore, there is a trade-off between performance and complexity appropriate to the transmitter and its application.

$$\text{CK\_out}^d = f^d(\text{Image}_i \otimes \text{Filter}_d + \text{Bias\_filter}_d) \quad (2)$$

The output of $d^{th}$ convolving filter, $\text{CK\_out}^d$, is fed to the fully connected NN layer having N neurons. Equation 3 describes the output $\text{FC\_out}_n^1$ of the $n^{th}$ neuron, in the fully connected layer 704 as a function of neuron weights $W_{i,j}^{d,n}$ and biases of the first neural layer $\text{Bias\_FC}_n^1$ and the second neural layer $\text{Bias\_FC}_n^2$. Herein, ψ, is the activation function and D is the number of convolving filters. In the last stage, the output layer 706 generates the pre-distorted $I_{out}$ and $Q_{out}$ signal according to Eq. 4 and Eq. 5 respectively. The last two layers are, a shallow NN with a low number of neurons. The number of neurons in the input layer may be selected based on the required performance and complexity. Another parameter in determining the final performance of the model is the activation function. In selecting of the appropriate activation function, both performance and activation function complexity should be considered. Generally, trigonometric functions add more computational complexity compared to a linear one.

$$FC\_out_n^1 = \psi\left(\sum_{d=1}^{D}\sum_{j=1}^{J}\sum_{i=1}^{I}CK_{out}^d(i,j) \times W_{i,j}^{d,n} + Bias\_FC_n^1\right) \quad (3)$$

$$I_{out}(n) = \sum_{n=1}^{N} FC\_out_n^1 \times W_{1,n} + Bias\_FC_1^2 \quad (4)$$

$$Q_{out}(n) = \sum_{n=1}^{N} FC\_out_n^1 \times W_{2,n} + Bias\_FC_2^2 \quad (5)$$

To train the CNN, a set of input output pairs $\{s_{\theta 1}, s_{\theta 2}, \ldots, s_{\theta M}\}$ may be captured at M angles across a given steering-angle range, assuming in this case a linear array with only the azimuth angle to be set). In an embodiment the training data may capture a peak of signals where highest nonlinearities occur. In a further embodiment, a sufficient number of peak samples of the signal envelop may be captured in the training data set, to allow for modelling of points with extreme nonlinearities. In a still further embodiment, the training data may include edges of the steering range and select points there between in order to further provide information about the behavior of the system across the steering range. To avoid time series prediction of the actual data instead of modeling the beamforming transmitter behavior, the training data images may be randomized and shuffled in both angle and signal sequence, such that two successive training images end up in different timing sequences and for different steering angle values.

The DPD model is trained for the transmitter parameters (convolving filters, shallow NN weights and biases) to minimize the cost function. The cost function is a mean square error, defined as follows:

$$MSE(s) = \frac{1}{s}\sum_{s=1}^{S}\left[(I(s) - I'(s))^2 + (Q(s) - Q'(s))^2\right]$$

where I', Q', I and Q are the modeled and measured I and Q data, respectively, S is the number of data points The cost function is calculated over number of epochs. An optimizer, such as an Adam optimizer may be implemented to minimize the cost function. At the end of each epoch the model parameters are updated. In an embodiment modeling performance may be measured in the term of normalized mean square error (NMSE), and calculated as:

$$NMSE = 10.\log\left(\frac{\frac{1}{s}\sum_{s=1}^{s=S}\left[(I(s) - I'(s))^2 + (Q(s) - Q'(s))^2\right]}{\frac{1}{s}\sum_{s=1}^{s=S}\left[(I(s))^2 + (Q(s))^2\right]}\right)$$

In some embodiments to reduce the CNN complexity, a transfer training technique is used. In this technique, the convolutional layer is only trained once, and only the fully connected layer may be retrained at run-time. This feature substantially reduces the system complexity and makes a suitable solution for field applications.

In summary, inputs to the system are the complex modulated signal, and the steering beam angle; they are the inputs to the data preparation section to form the data container/image. The data image is then passed to the DPD actuator to generate the pre-distorted signal. Afterward, the DPD actuator reads the DPD coefficients from the DPD generator block and applies them to the signal. It may be noted that one may confuse the nonlinearity order of a memory polynomial with the CNN input image nonlinearity order. I may be seen that an advantage of the DPD actuator according to embodiments of the present matter is that it very quickly, continuously, and accurately linearizes the transmitted beam across the steering range without any need for adaption of the DPD model. A further advantage of DPD architecture is the ability of linearizing the beamforming transmitter across the steering range while being trained using a limited number of training angles. In other words, the DPD architecture predicts a behavior of the beamforming transmitter at any steering direction based on using a finite number of training scenarios.

Figure 8:
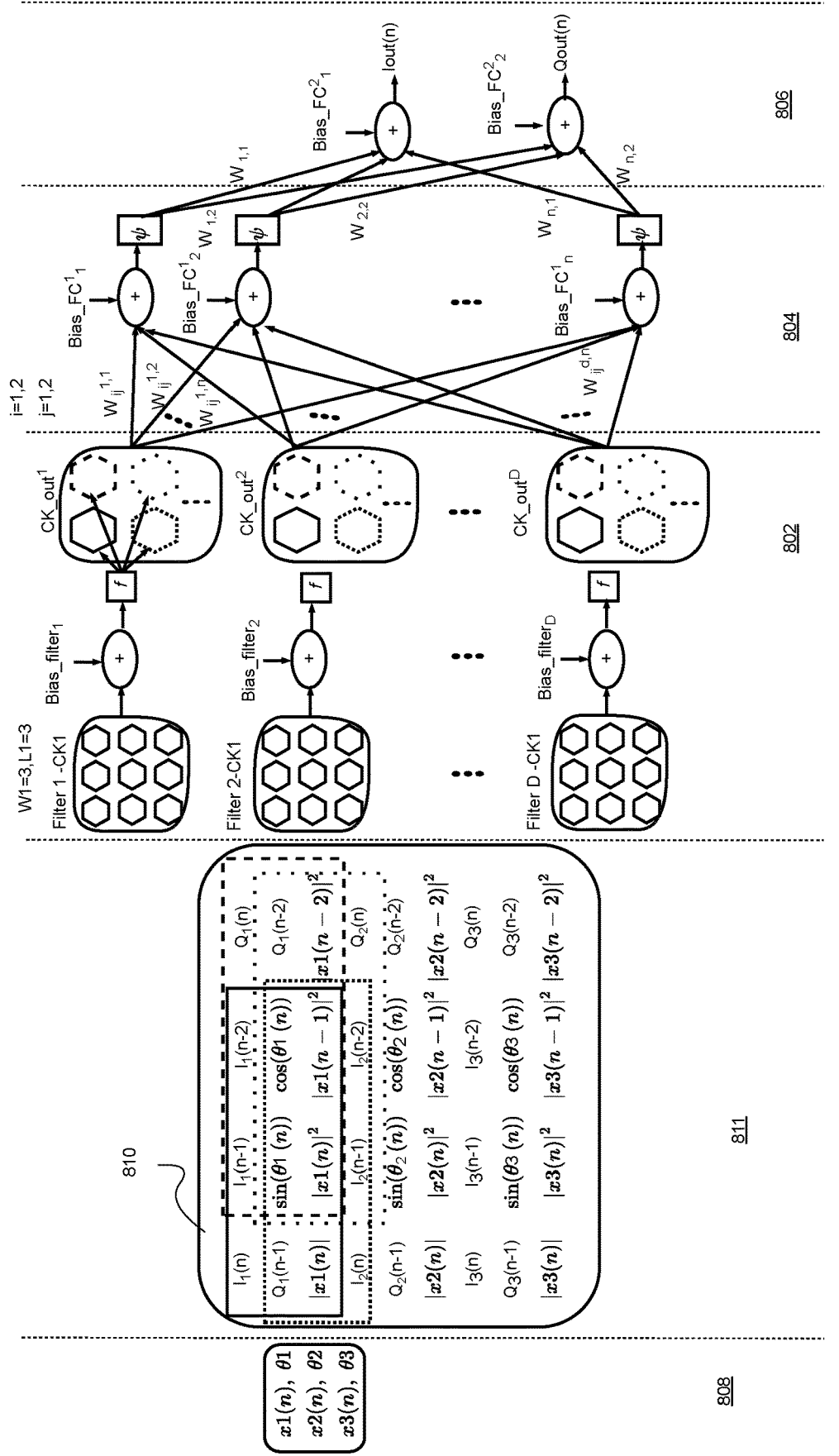
FIG. 8 shows a block diagram of linearizer configured with a NN model for implementing a DPD actuator for a phased array MIMO beamforming transmitter according to another embodiment of the present matter.

Referring now to FIG. 8 there is shown a block diagram of linearizer 800 configured with NN model for implementing the DPD actuator 320 shown in FIG. 3, for a phased array MIMO beamforming transmitter according to another embodiment of the present matter. The block diagram 800 shows the linearizer for single branch (for one subarray and having three sub-arrays/streams/beams) of the MIMO transmitter. The MIMO beamforming transmitter may be subject to different operating conditions that affect impairment in addition to beam steering angle (as in the SISO beamforming embodiment 700) and may include, but not limited to, one or more of crosstalk, beamforming in a far field, and IQ imbalances. Thus, the MIMO DPD actuator 800 according to embodiments of the present matter is configured to identify and compensate for subarray effects of neighboring subarrays to a principal subarray. Each subarray may transmit at any arbitrary direction $\theta_S$ and the impairment effects are a function of the beam direction θs. Accordingly with regard to crosstalk impairments we may consider, an $s^{th}$ subarray in the MIMO beamforming transmitter may be modeled as follows:

$$y_{s,\theta}(n) = \sum_{s-1}^{s+1}\sum_{m=0}^{M-1}\sum_{k=0}^{K-1}c_{m,k}^{\theta,s} \cdot x_s(n-m) \cdot |x_s(n-m)|^k$$

This contrasts with the case where crosstalk is not considered and the model is reduced to:

$$y_{s,\theta}(n) = \sum_{m=0}^{M-1}\sum_{k=0}^{K-1}c_{m,k}^{\theta,s} \cdot x_s(n-m) \cdot |x_s(n-m)|^k$$

where the $\theta_s$ is the $s^{th}$ subarray radiating direction, $c_{m,k}^{\theta,s}$ is the $s^{th}$ transmitter model coefficient in the direction θ. As may be seen from the above equation the subarray output is a function of i) the subarray transmitting data, ii) the subarray steering direction, and iii) the parameters of the neighbouring subarrays s−1, s+1 as well.

As described previously in reference to the embodiment of the linearizer 700, the embodiment of the linearizer 800 similarly notionally includes five layers: an input layer, an image layer (data container/image), a convolutional layer, a fully connected NN layer, and an output layer. The input layer 808 inputs the time discrete base band (I(n), Q(n)) data, along with the beam steering angle θ(n) for the principal subarray and the parameters of the neighboring subarrays. The image 810 in the includes the data organized in a 2D data container with its entries, which depend on the I/Q baseband signal samples and the steering angle values various formations' candidates as it proved to offer the best performance. Each image is composed of two types of information, signal information including I(n), Q(n) and the magnitude |x(n)| and transmitting angle of subarrays. Moreover, each image represents the data frame for a specific steering angle θ(n).

The input image is passed through pre-defined convolutional filters. These filters are Convolving Kernels (CKs) performing a dot operation on the input image to extract feature maps. The convolving kernels reduce the data size for the downstream layers. This is illustrated graphically in layer 802, which shows the convolution operation on the input image using the $d^{th}$ CK with a size of 3×3. The CK may operate with a one-step stride-convolution step, or more depending on the system design. The parameters in this stage are the number of CKs and the CK size. The CK size is the number of rows and columns that each CK covers during a single convolution operation. The overall performance of the linearizer is influenced by the number of kernels and the number of layers as well. The convolving layer may be trained to be fixed as it is responsible to extract the system features while the downstream shallow NN may be trained to fine tune the output for each subarray, this method is referred to as transfer. The transfer technique may substantially reduce training complexity by reusing the already trained convolutional layer.

In the fully connected layer 804 the $d^{th}$ feature map, $CK\_out^d$, is fed to a series of fully connected NN 804 with Ns neurons to generate the predistorted data. The equation below describes the output of the nth neuron in sth array, $FC\_out_n^1$,s in the fully connected layer as a function of the neuron weights w n and biases.

$$FC\_out_n^1 = \psi(\Sigma_{d=1}^D \Sigma_{j=1}^J CK\_out^d(i,j) \times W_{i,j}^{d,n} + \text{Bias\_FC}_n^1)$$

Herein, ψ, is the activation function, D is the number of convolving filters for the s subarray. Finally, in the last stage, the output layer generates the subarrays' pre-distorted Iouts and Qouts signal according to following equations $$I_{out}(n) = \sum_{n=1}^N FC\_out_n^1 \times W_{1,n} + \text{Bias\_FC}_1^2$$

$$Q_{out}(n) = \sum_{n=1}^N FC_{out_n}^1 \times W_{2,n} + \text{Bias}_{FC_2^2}$$

The number of neurons in the input layer may be selected based on a desired performance and complexity. Further, in selecting an appropriate activation function, both performance, and activation function complexity may be considered. Generally, trigonometric functions add more computational complexity compared to a linear function.

Factors to consider during the training phase were described earlier with respect to the SISO embodiment of the linearizer 700. The training phase of the linearizer 800 may additionally include neighbouring subarrays information to assist the DPD in compensating for the crosstalk effects, and in-band interference. To avoid time series prediction of the actual data instead of modeling the MIMO beamforming transmitter behavior, the training images may be randomised and shuffled in both angle and signal sequence, such that two successive training images end up in different timing sequences and different steering angle values. As in the previously described embodiment 700, the DPD model is trained for the network parameters (CK filters, shallow NN weights and biases) to minimize the cost function. The final outputs of CK layers are passed to a fully connected shallow neural network (FC SNN) to calculate the pre-distorted signal.

Figure 9:
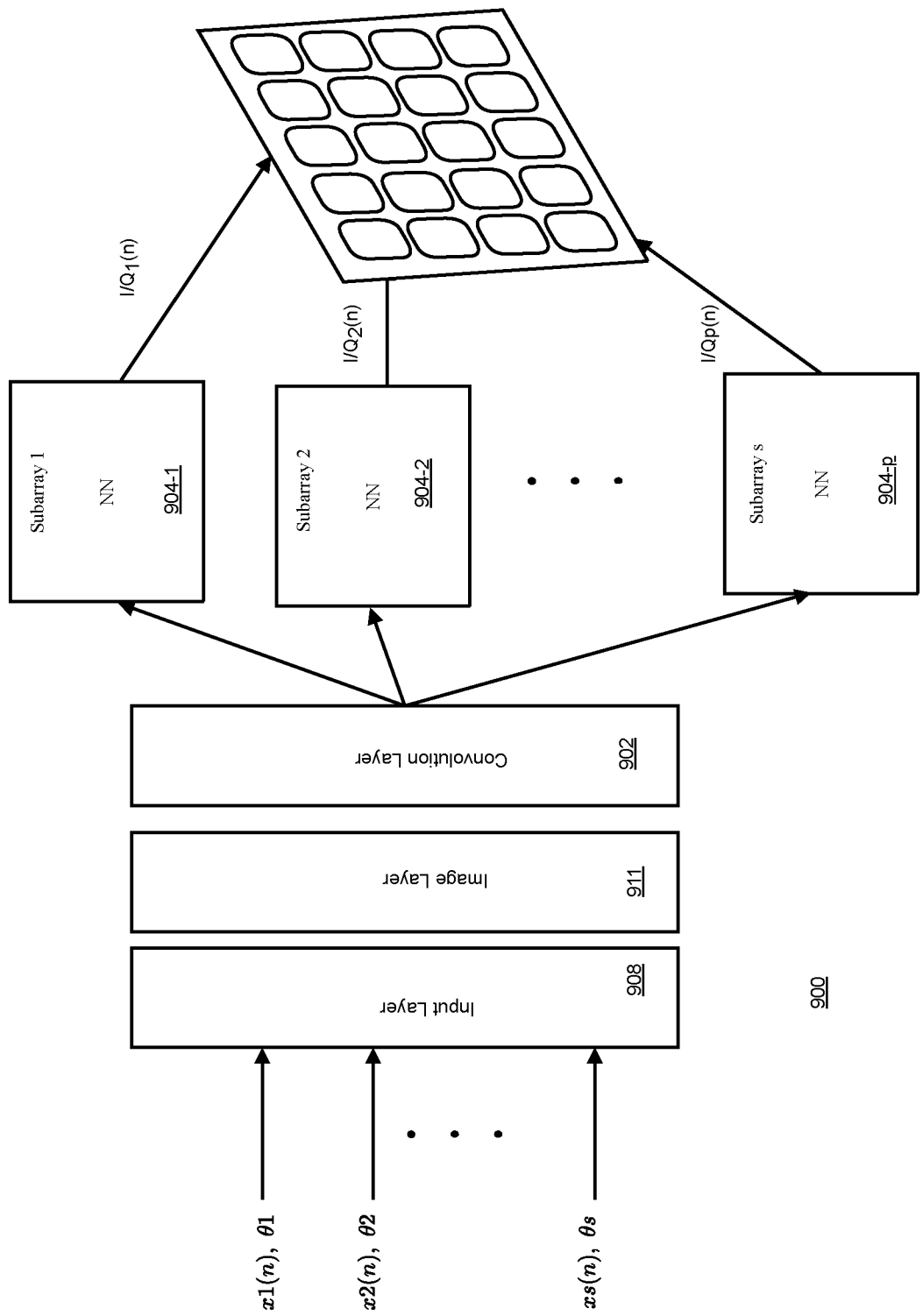
FIG. 9 shows a generalised block diagram of a multi-stream MIMO beamforming transmitter according to another embodiment of the present matter.

Referring to FIG. 9 there is shown a block diagram of a multi-stream MIMO beamforming transmitter 900 according to another embodiment of the present matter. The transmitter architecture 900 comprises an input layer 908, image layer 911 convolution layer 902 and a subarray NN for each subarray input layer 908-1, 908-2, . . . 908-s. The input layer 908 for receiving each of a plurality of time discrete multi-stream input signals $x_1(n), x_2(n), \ldots x_s(n)$ and respective corresponding beam angles $\theta_1, \theta_2, \ldots \theta_s$. Outputs from the input layer 908 are passed to the shared image layer 911 which generates a data image of the input signals and operating conditions of the MIMO transmitter to represent a data frame for a specific steering angle θ(n) in a manner as described earlier. The data image is processed by the shared convolution layer 902 to generate the feature maps which are passed to the series of fine tuning shallow neural networks 908-1, 908-2, . . . 908-s. The shared convolution layer is responsible for extracting the common features from the input image. The shallow neural networks are on the other hand responsible for fine tuning the output for each subarray before being applied to the subarrays corresponding antenna subarray. The architecture reduces complexity allows use of the transfer technique. In the case of using the transfer technique, the shared convolutional layer may be trained once while fine tunning of the subarray NN (DPD actuators) may be occasionally updated during runtime operation. The 908 is the input data including modulated input data for subarray 1, 2, 3 and their steering angle. The 911 is the input image with adequate memory taps and nonlinearity order. The 902 is the common convolutional layer to extract the common features. The 904-1 is the first shallow neural network to generate the right pre-distorted signal for the first subarray. The 904-s is the $s^{th}$ shallow neural network that takes the feature maps from the common convolving layer 902 and output the right pre-distorted signal for the $s^{th}$ subarray.

Figure 10:
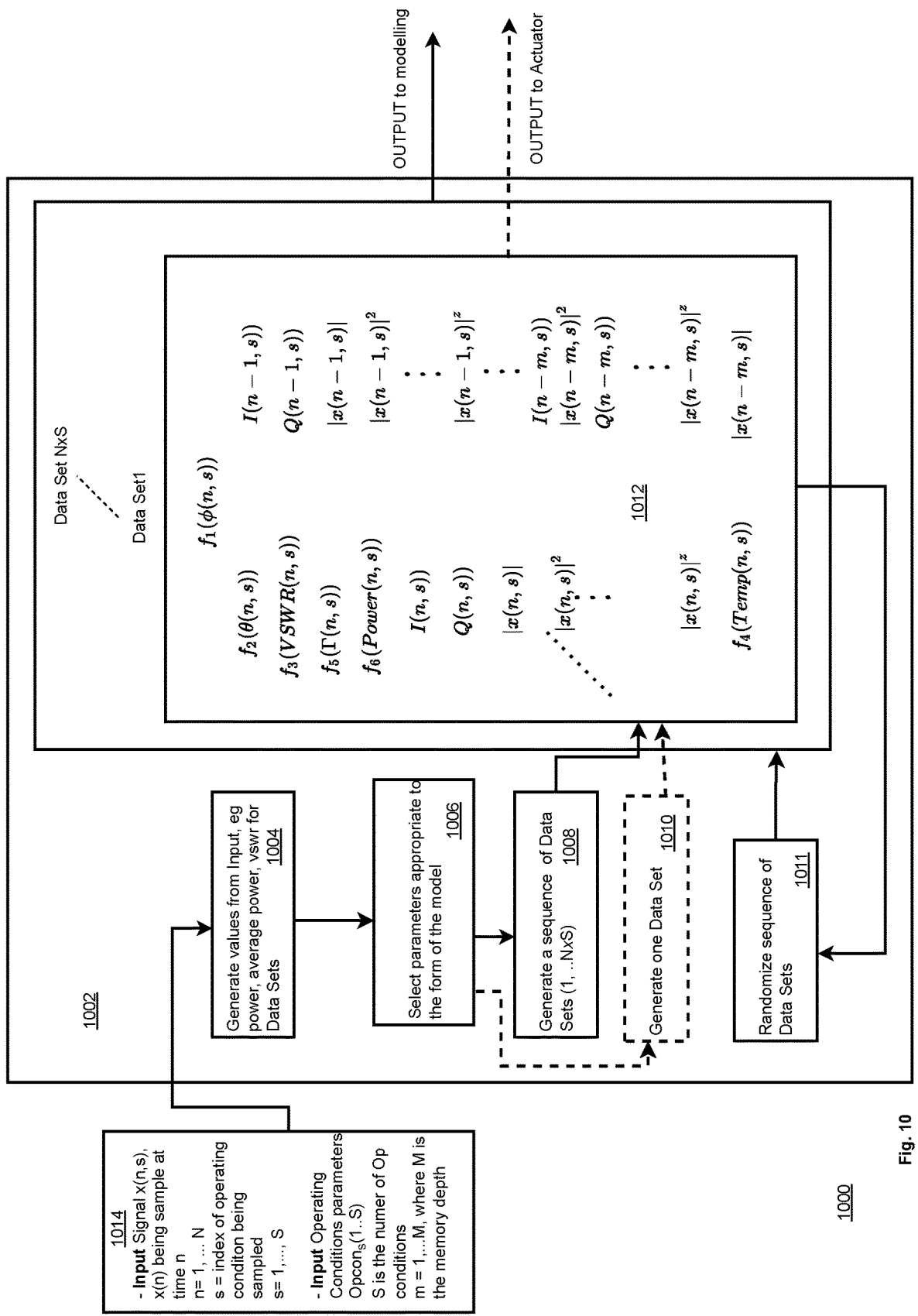
FIG. 10 shows a functional flow chart of a method for generating of data sets for input to a DPD actuator according to one embodiment of the present matter.

Referring to FIG. 10 there is shown a functional flow chart 1000 for generating the data-conditioning component 1002 according to one embodiment of the present matter. As described earlier herein, the form of the DPD model may be based on, and not limited to CNN, DNN, analytical, series based, and polynomial series of basis functions. For a given sub-array, the input signals x(t), angle data and operating conditions parameters at block 1014 are input to the data conditioning block 1002. At step 1004 appropriate generated values, for example VSWR, reflections coefficients power or average power are generated from the input data 1014 and operating conditions parameters, which may be provided for example by sensors, such as temperature, impedance. Conditioning may in some embodiments include scaling the input or generated values by a predetermined scaling factor or normalizing values or mapping functions. At step 1006 values to be used in the model as inputs to the model may be selected. At step 1008 a sequence of data sets 1012 is generated. The data set 1012 may include mapping functions $f_i(g(n,s))$, where $i=1 \ldots I$. The index s is the operating condition parameter with $s=\{1:S\}$. Depending on the training algorithm, procedure, and the characteristics of the considered sub-array transmitter, the operating condition parameter may include one or more of beam angle (azimuth and elevation), VSWR, reflection coefficient Γ, signal power, and temperature (PA, ambient). The mapping functions $f_i(g(n,s))$ transfer (i) the input signal characteristics $I_{in}(n)$, $Q_{in}(n)$ and their time delayed values with different orders such as $|(x(n,s))|^z$ and $|(x(n-m, s)|^z$, m=1, 2, 3 . . . , and z=1, 2, 3 . . . (z is the nonlinearity order and m is the memory depth. The memory depth and nonlinearity orders are specific to the PA type and overall structure of the transmitter) along with the amplitude of the complex input signal; (ii) the transmitter setting variables such as the azimuth and elevation angles (φ, θ) of the beam direction and the average power of the signal P; (iii) the operating and environmental conditions of the transmitter such as the temperature T of the base plate of the power amplifier and/or other components that may affect linearity, and (iv) the mismatch levels at the interface of the power amplifiers and the antennas elements, expressed reflection coefficients, $\Gamma_i$. The above listed parameters and variables are given only as examples to illustrate how to construct the data set in the data conditioning component, other parameters such as the crosstalk between the transmitter branches and the cross coupling between the antenna elements may also be included. The above procedure is repeated using the input signal and the operating conditions N times to generate N data sets 1012. These N data sets are shuffled to generate a randomised data sets 1011 that can be used for the DPD training and the model identification.

In the DPD operation, the DPD actuator receives a one-instant scaled data set 1010, which forms the data image 1012 and is passed through the CN and FC layer to generate the DPD signal output.

Referring to FIG. 11*a* there is shown a block diagram of a linearizer applied to a radio-over-fiber (RoF) transmitter (Tx) 1100, according to an embodiment of the present matter. The RoF transmitter 1100 includes an optoelectronic transceiver 1101 having an optical source 1102, such as a laser, for generating an optical carrier signal, an optical modulator 1103 (electro-optic converter, such as a Mach Zehnder modulator), configured to receive a predistorted signal from a DPD actuator 208 configured with a predistortion model according to embodiments of the present matter, and generate a modulated optical signal and an optical amplifier 1104 for amplifying the optical signal for transmission over an optical channel 1106 (e.g. optical fibre or optical free space link) to an electro-optic transmitter chain comprised of a photodetector 1107 for receiving the optical signal over the optical channel 1106 and reconverting the received signal to an electrical signal for application to a frequency up converter 1151 before amplification by an RF amplifier 1152 for transmission via an antenna 1153.

Input to the RoF Tx 1100 is an input electrical signal x(t) 204 to be transmitted by the antenna 1153. The operating conditions parameter signals 206 of the RoF transmitter and the input signal 204 are inputs to the DPD actuator 208. Training of the DPD model having a single set of coefficients over a selected operating range of the RoF transmitter may be performed in a similar manner as described in any of the earlier embodiments of the present matter. In operation the optoelectronic transceiver 1101 receivers the predistorted signal from the DPD actuator and converts the electrical signal to an optical signal coupled to the input of the optical channel 1106 and then converted back to an electrical signal at the output of the optical channel in addition to an electrical frequency up-converter 1151 and a power amplifier 1152. The operating conditions parameter signals 206 for the RoF that affect transfer characteristics of the transmission chain may include one or more of temperature, humidity, pressure, radiation level, biasing values, coupling values, beamforming phases and magnitudes, antenna cross-coupling coefficients, antenna subarray cross-coupling coefficients, leakage currents, impedance mismatch, reflection coefficients, and load characteristics, optical source nonlinearity, optical modulator nonlinearity, optical channel chromatic dispersion and photodetector nonlinearity, and impairments generated by optical, electrical and opto-electrical components. In addition, computed or derived signal parameters from the information carrying signal may include power, bandwidth, and peak-to-average power ratio. As previously described herein, a data set of the input signals is generated for application to the DPD model.

Referring to FIG. 11*b* there is shown a block diagram of a linearizer applied to a RoF transmitter 1160, according to a further embodiment of the present matter. While similar to the embodiment 1100, the RoF transmitter 1160 is configured with direct modulation where the electrical signal may be used to directly modulate an electrical bias (such as a power supply of the laser) of the optical source 1162. In an embodiment the directly modulated optical source 1162 includes a laser configure to be responsive to electrical bias to emit a modulated optical carrier, in contrast to the non-modulated optical carrier having an external or separate modulator as in the architecture of the RoF transmitter 1100.

In further embodiments according to the present matter, a polynomial basis form of the DPD actuator model may be implemented. For an PA with a baseband input signal x(n) and baseband output signal respectively y(n). The following polynomial is typically employed:

$$y_{MP} = \sum_{k=0}^{K-1}\sum_{m=0}^{M-1} a_{km} \cdot x(n-m) \cdot |x(n-m)|^k$$

where M, K, denotes the memory depth, nonlinearity order.

Due to the mismatch between the PA output impedance $Z_{out}$ and the load impedance $Z_L$ seen by the PA (which is the antenna input impedance in of a transmitter) and the cross-coupling between the antennas elements, the ratio of the complex output signal of the signal entering the output port of the PA, ($b_2$) and the signal flow out of the PA ($a_2$) can be modeled using the actual reflection (Γ) at the interface of the PA and the antenna and may be defined by:

$$\Gamma = \frac{a_2}{b_2} = \frac{Z_L - Z_{out}^*}{Z_L + Z_{out}}$$

where $Z_{out}^*$ is the complex conjugate of $Z_{out}$, $a_2$ and $b_2$ are the reflected and incident waves, respectively at the interface of the output of the PA and the antenna's input.

A crossover memory polynomial may be mathematically expressed as $$y_1(n) = \sum_{k=0}^{K_1-1}\sum_{m=0}^{M_1-1} b_{km}(\Gamma) \cdot x_1(n-m) \cdot |x_1(n-m)|^k \cdot |x_2(n-m)|^k +$$

$$\sum_{k=0}^{K_2-1}\sum_{m=0}^{M_2-1} c_{km}(\Gamma) \cdot x_2(n-m) \cdot |x_1(n-m)|^k \cdot |x_2(n-m)|^k$$

Where $x_1$ is the input data to the PA, $y_1$ is the output of the branch 1, and the $x_2$ is the cumulative signal entering the output of the PA that may be due to one or more of impedance mismatch between the PA and the antenna, coupling signals from adjacent antennas elements of a given a sub-array or from neighbouring sub-arrays. This model requires extraction of different sets of model coefficients ($a_{km}(\Gamma)$ and $b_{km}(\Gamma)$) for each value of training load points, array settings and coupling conditions. These sets of model coefficients are used to interpolate between testing load points, which overall may be computationally burdensome.

According to an embodiment of the present matter, instead of choosing reflection-dependent model coefficients, the model may include a reflection coefficient as one of the model inputs.

Thus, the memory polynomial model with F is mathematically expressed as $$y(n) = \sum_{k=0}^{K_1-1} \sum_{m=0}^{M_1-1} d_{km} \cdot x(n-m) \cdot \Gamma \cdot |x(n-m) \cdot \Gamma|^k$$

According to an embodiment of the present matter a method for generating a behavioral PA model includes: capturing waveforms at training load points, input to and output from the PA under different load reflection terminations; measuring the captured waveforms; recording an actual reflection coefficient ($\Gamma$) of each training load points along with a corresponding input and output waveforms; data conditioning by embedding the reflection coefficient ($\Gamma$) with the input signal data to generate new data to be used to extract a valid model for a range of operating conditions, generating a single set of model coefficients based on a modified memory polynomial form of the model; and calculating for a range of given test load points, a normalized mean square error (NMSE) between measured and modeled outputs to assess the robustness and accuracy of the model.

According to an aspect of the present matter, a CNN maybe used for the transmitter modeling and linearization. In this example, the implementation of the invention on a transmitter modeled using m memory tap, an n nonlinearity order, transmitter dependant parameters, and modulated signals from the other subarrays, with a steering angle of each subarray is arranged into an image (to use the terminology of CNN) and fed to the CNN network for both training the DPD and generating the pre-distorted signal.

According to another aspect of the present matter the modulated signal of the surrounding subarrays is considered to be a part of input data and fed to the CNN. Using this technique, the model can compensate for the crosstalk and coupling effects in MIMO radio transmitters across the steering range.

In accordance with still further aspects of the present matter, the steering angle of the intended subarray for linearization, and the surrounding subarrays are fed to DPD actuator to capture their effect on the behaviour of the intended subarray for linearization.

In accordance with further aspects of the present matter a processor is configured to compute the CNN coefficients including filter and neural network weights.

In accordance with further aspects of the present matter one DPD is considered for each subarray, however the DPD architecture can be modified so that one DPD is able to linearize all the subarrays but with a bit of loss in the overall linearization performance. The linearization performance is defined by the ACPR and the inverse modeling accuracy.

In according to another aspect of the present matter, the DPD actuator may be implemented using a modified CNN architecture. Herein, the input signals of P subarrays alongside the steering angles are organized into input image used to generate the pre-distorted signal.

According to another aspect of the present matter, the input image is fed to the DPD actuator. The architecture of the DPD actuator is comprised of a common convolving filter and P shallow neural networks. The common convolutional layer extracts the data features and pass them to the shallow NN.

In accordance with further aspects of the present matter, the shallow NNs convert the features to appropriate pre-distorted signal for each subarray.

In accordance with a further aspect, the DPD actuator is implemented using a memory polynomial, wherein the DPD actuator is operable over a range of operating conditions based on a single set of DPD coefficients.

In accordance with a general aspect, parameters other than the modulated signal including power amplifier substrate temperature and signal average power on the power amplifier behaviour are processed to identify the DPD. A CNN network or polynomial network may be used to generate the pre-distorted signal according to input modulated signal, the signal's average power and the power amplifier substrate temperature.

While the description exemplified RF and optoelectronic systems, the linearizer according to embodiments of the present matter may equally well be applied different systems that introduce nonlinear distortions in a signal path, these may include one or more of wireless communication systems, wireless devices, wired cable transmission systems, optical and optoelectronic systems, SISO, MIMO, and multiband MIMO, optoelectronic radio-over-fibre transmitters, satellite communications for both terrestrial transmission segments and space transmission segments, wireless, digital video broadcasting, cable transmission networks and systems having combinations thereof. Furthermore, the transmission chain may comprise one or more elements selected from a set comprising PAs, antennas, couplers, wireless transmission paths, wired transmission paths, optical paths including optical fiber and free space mediums, optical transmitters and receivers, RF paths, baseband paths, time delay elements, combiners, phase shifters, signal attenuators, photodetectors, gain adjusters, predistorters, low noise amplifiers, RF modulators, optical modulators, and optical amplifiers.

The invention claimed is:

1. A linearizer for a transmitter, comprising:
an input interface for inputting linearizer signals, the linearizer signals comprising:
information carrying signals; and
operating conditions parameter signals, other than the information carrying signal, representing metrics affecting transfer characteristics of the transmitter over an entirety of the transmitter operating range;
a data conditioning circuit coupled to input said linearizer signals from said input interface and being configured to apply a preconditioning operation to the input linearizer signals based on said operating conditions parameter signals, the preconditioning operation being independent of nonlinearities in the transmitter, to output a single preconditioned signal; and
a predistortion actuator circuit, having a single input and a single output, configured with a predistortion model for predistorting at least part of the information carrying signals to produce predistorted signals in response to the output single preconditioned signal applied to the single input, the predistortion model of the configured predistortion actuator using a single set of model coefficients that are unchanged, for changing operating condition parameter signals and changing information carrying signals, over said entirety of said operating range.

2. The linearizer of claim 1, wherein the model having said single set of coefficients is generated using the representation of the information carrying signals and operating conditions parameter signals over said entirety of said selected operating range.

3. The linearizer of claim 1, wherein the predistortion model is one of a plurality of predistortion models, each having a corresponding single set of model coefficients.

4. The linearizer of claim 1, wherein the linearizer signals are a data set comprising:
  samples of said information carrying signal; and
  at least one or more samples of:
    said operating conditions parameter signals
    and derived signals, being derived from samples of said information carrying signal and said operating conditions parameter signals.

5. The linearizer of claim 4, wherein the data conditioning circuit includes a convolution function for applying convolving filters to elements of said data set to generate convolved data sets for said representation of the linearizer signals.

6. The linearizer of claim 4, wherein the data conditioning circuit includes selecting a subset of elements of said data set for said representation of the linearizer signals.

7. The linearizer of claim 4, wherein the data conditioning circuit includes scaling elements and data fusion processing of said data set for said representation of the linearizer signals.

8. The linearizer of claim 4, wherein the data set includes one or more of:
  information signal power, information signal bandwidth, information signal peak to average power ratio, temperature, humidity, pressure, radiation level, biasing values, coupling values, beamforming phases and magnitudes, antenna cross-coupling coefficients, antenna subarray cross-coupling coefficients, leakage currents, impedance mismatch, reflection coefficients, environmental related parameters, other information other than environmental related parameters and load characteristics.

9. The linearizer of claim 1, wherein in the transmitter is one of a single input single output (SISO) transmitter, multiple input multiple output (MIMO) transmitter, massive MIMI (mMIMO) transmitter, phased array transmitter, single-band transmitter, and multi-band transmitter or radio over fiber (RoF) transmitter.

10. The linearizer of claim 1, wherein said transmitter includes an optoelectronic transmitter comprising: an optical modulator responsive to an electrical signal, being a representation of predistorted signals, for generating a modulated optical signal, an optical channel for carrying said modulated optical signal, a photodetector as an optical-to-electrical converter and a radio-frequency amplifier for amplifying an electrical version of said modulated optical signal.

11. The linearizer of claim 10, including a data conditioning circuit coupled to receive said linearizer signals and being configured to generate a representation of the linearizer signals for application to the predistortion model, the representation comprising a data set including one or more of:
  information carrying signal power, bandwidth, and peak-to-average power ratio, temperature, humidity, pressure, radiation level, biasing values, coupling values, beamforming phases and magnitudes, antenna cross-coupling coefficients, antenna subarray cross-coupling coefficients, leakage currents, impedance mismatch, reflection coefficients, and load characteristics, optical source nonlinearity, optical modulator nonlinearity, optical channel chromatic dispersion and photodetector nonlinearity, and impairments generated by optical, electrical and opto-electrical components.

12. The linearizer of claim 1 wherein said transmitter includes a transmission chain for transmitting a signal in a selected direction and said predistorter being further configured in said transmission chain for applying said distortion to the information carrying signal before transmission in said selected direction and wherein the predistortion is at least based on operating and environmental conditions of the transmission chain.

13. A method for a linearizing a transmitter comprising:
  using a single predistortion model for a linearizer;
  generating said predistortion model by
    comparing a set of samples of a single preconditioned signals and a set of samples of the transmitter output signals for different transmitter operating conditions over an entirety of the transmitter operating range, the single preconditioned signal being generated by
    applying a preconditioning operation to input information carrying signal A samples and operation conditions parameter signal samples based on operating condition parameters, the preconditioning operation being independent of nonlinearities in the transmitter, to output the single preconditioned signal; and
  using said comparison to generate a single set of coefficients for said predistortion model for the linearizer, wherein the single set of coefficients is unchanged during operation of the linearizer over said entirety of said operating range and under different operating conditions of the transmitter.

14. The method of claim 13, wherein the input signal is a single signal, or a plurality of concurrent input signals.

15. The method of claim 13, wherein said set of samples of the output signal of transmitter is provided by one or more of signal couplers, near field observation receivers, and far-field receivers.

16. The method of claim 13, wherein the set of coefficients is derived by applying one of an indirect learning architecture, and direct learning architecture.

17. The method of claim 13, wherein the predistortion model is selected from one of a neural network, convolution neural network, deep neural network, shallow neural network, recurrent neural network, long short-term memory neural network, box-based Hammerstein-Wiener model, Volterra series based model, equation based models, data based model selected from one or more of a data classifier, data regressor, series based model and polynomial model.

18. The method of claim 13, including configuring a predistortion actuator circuit with the predistortion model for predistorting at least part of the information carrying signal to produce predistorted signals, in response to the information carrying signals and operating conditions parameter signals, other than the information carrying signals, the operating conditions parameters signals representing parameters affecting transfer characteristics of the transmitter, over an operable range of the transmitter.

19. The method of claim 13, wherein in the transmitter is one of a single-input single-output (SISO) transmitter, multiple-input multiple-output (MIMO) transmitter, massive MIMO (mMIMO) transmitter, phased array transmitter, single-band transmitter, and multi-band transmitter, a base station transceiver, and mobile terminal transceiver for down link and up-link communications.

20. The method of claim 13, wherein said transmitter includes an optoelectronic transmitter comprising: an optical modulator responsive to an electrical signal, being a representation of said predistorted signals, for generating a modulated optical signal, an optical channel for carrying said modulated optical signal, and a radio-frequency amplifier for amplifying an electrical version of said modulated optical signal received from said optical channel.

* * * * *